(12) United States Patent
Hofmeister et al.

(10) Patent No.: US 6,364,593 B1
(45) Date of Patent: Apr. 2, 2002

(54) MATERIAL TRANSPORT SYSTEM

(75) Inventors: Christopher Hofmeister, Hampstead, NH (US); Glenn L Sindledecker, Dracut, MA (US)

(73) Assignee: Brooks Automation, Chelmsford, MA (US)

(*) Notice: Subject to any disclaimer, the term of this patent is extended or adjusted under 35 U.S.C. 154(b) by 0 days.

(21) Appl. No.: 09/588,392

(22) Filed: Jun. 6, 2000

(51) Int. Cl.⁷ ............................................... B65G 25/04
(52) U.S. Cl. ..................................... 414/217.1; 414/940
(58) Field of Search ............................... 414/217, 217.1, 414/416.08, 684.3, 939, 940; 198/950

(56) References Cited

U.S. PATENT DOCUMENTS

| | | | |
|---|---|---|---|
| 4,497,254 A | * 2/1985 | Schmidt | 198/950 |
| 4,674,939 A | 6/1987 | Maney et al. | 414/411 X |
| 4,758,127 A | 7/1988 | Imai et al. | 414/411 |
| 4,995,430 A | 2/1991 | Bonora et al. | 141/98 |
| 5,139,459 A | 8/1992 | Takahashi et al. | 414/217 X |
| 5,203,445 A | * 4/1993 | Shiraiwa | 414/940 |
| 5,291,923 A | 3/1994 | Gallagher et al. | 414/217 X |
| 5,364,219 A | 11/1994 | Takahashi et al. | 414/939 X |
| 5,431,600 A | 7/1995 | Murata et al. | 414/940 X |
| 5,509,772 A | 4/1996 | Doche | 414/940 X |
| 5,540,098 A | 7/1996 | Ohsawa | 73/629 |
| 5,562,383 A | 10/1996 | Iwai et al. | 414/940 X |
| 5,607,276 A | 3/1997 | Muka et al. | 414/940 X |
| 5,772,386 A | 6/1998 | Magkes et al. | 414/411 |
| 6,120,229 A | * 9/2000 | Hofmeister | 414/940 |
| 6,186,723 B1 | * 2/2001 | Murata et al. | 414/940 |

FOREIGN PATENT DOCUMENTS

| | | |
|---|---|---|
| JP | 4-360545 | 4/1992 |
| JP | 5-338728 | 5/1993 |

OTHER PUBLICATIONS

Patent Abstracts of Japan, Publication No. 06037175A, published Oct. 2, 1994, 1 page.
Patent Abstracts of Japan, Publication No. 01145906A, published Jul. 8, 1989, 1 pag.

* cited by examiner

Primary Examiner—Joseph E. Valenza
(74) Attorney, Agent, or Firm—Perman & Green, LLP

(57) ABSTRACT

A system for loading and unloading semiconductor wafers includes a frame having a charging opening, a platform mounted on the frame and movable between a deployed position and a retracted position, and a movable closure for the charging opening for opening and closing a horizontal path through the charging opening. In the deployed position, the platform has a generally level orientation adjacent the charging opening and projects away from the frame for receiving thereon a cassette adapted to support therein a plurality of the semiconductor wafers to be passed though the charging opening. In one embodiment, the platform is elevationally movable on the frame between a retracted lowered position distant from the charging opening and a deployed raised position adjacent the charging opening. In another embodiment, the platform is rotationally movable on the frame between the deployed position having a generally level orientation located generally adjacent the charging opening and the retracted position folded against the frame. The loading and unloading system includes a transport system for advancing a cassette from a remote location and delivering the cassette onto the platform in the deployed position. The transport system includes a nest member for supporting a cassette at spaced apart locations enabling reception therebetween of the platform in the deployed position so that the cassette can selectively be transferred, in one instance, from the nest member to the platform and, in another instance, from the platform to the nest member.

17 Claims, 21 Drawing Sheets

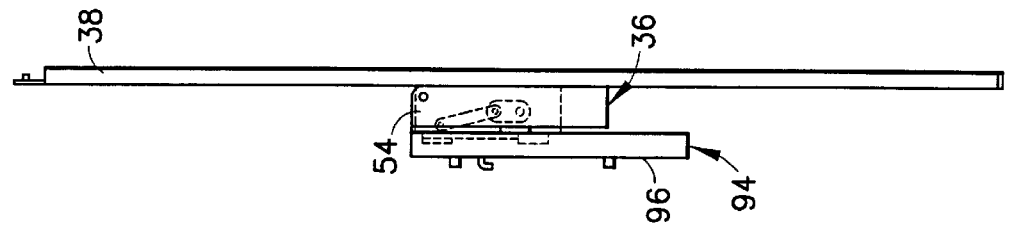
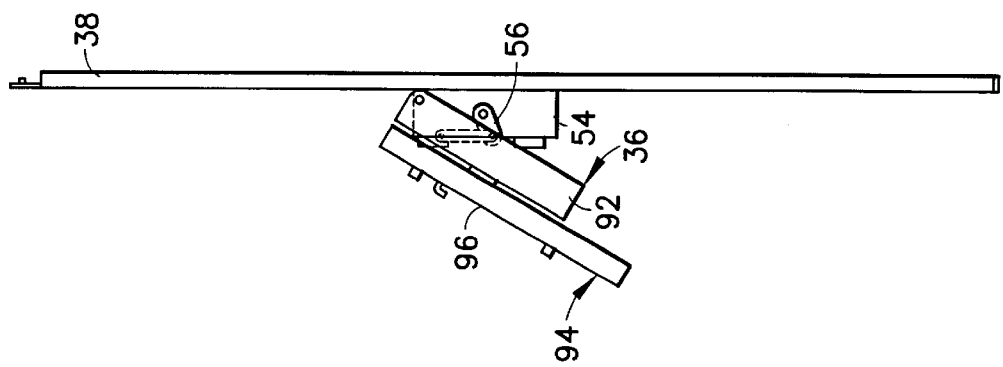
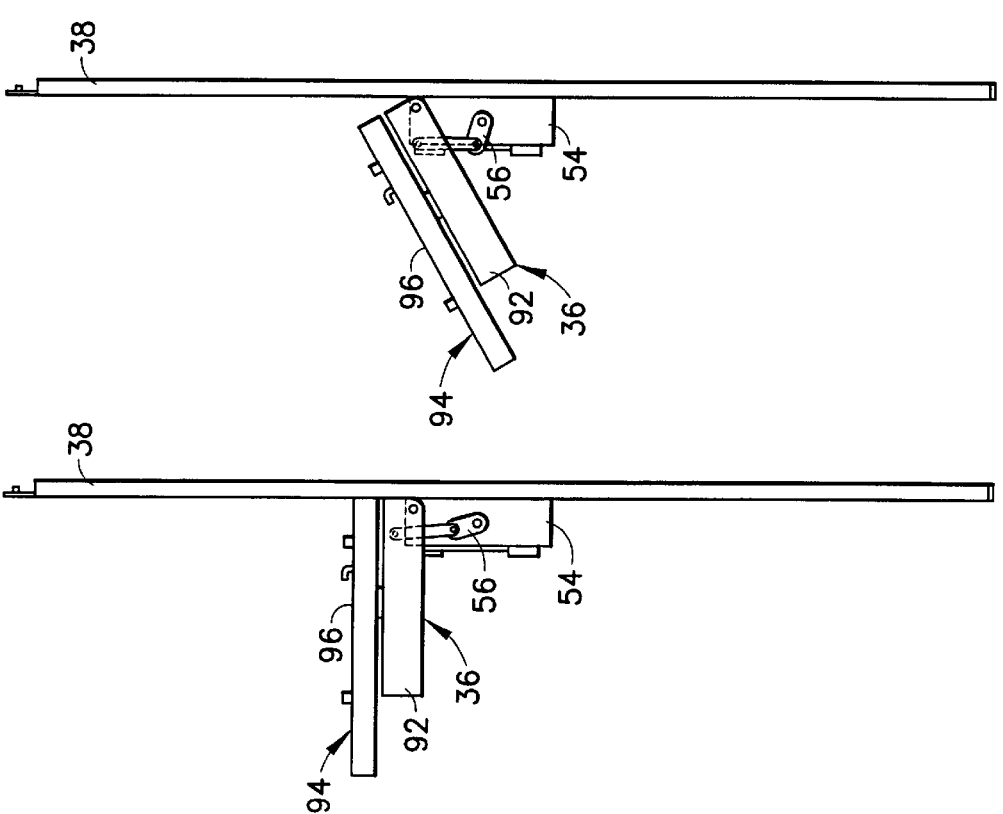
FIG.4A  FIG.4B  FIG.4C  FIG.4D

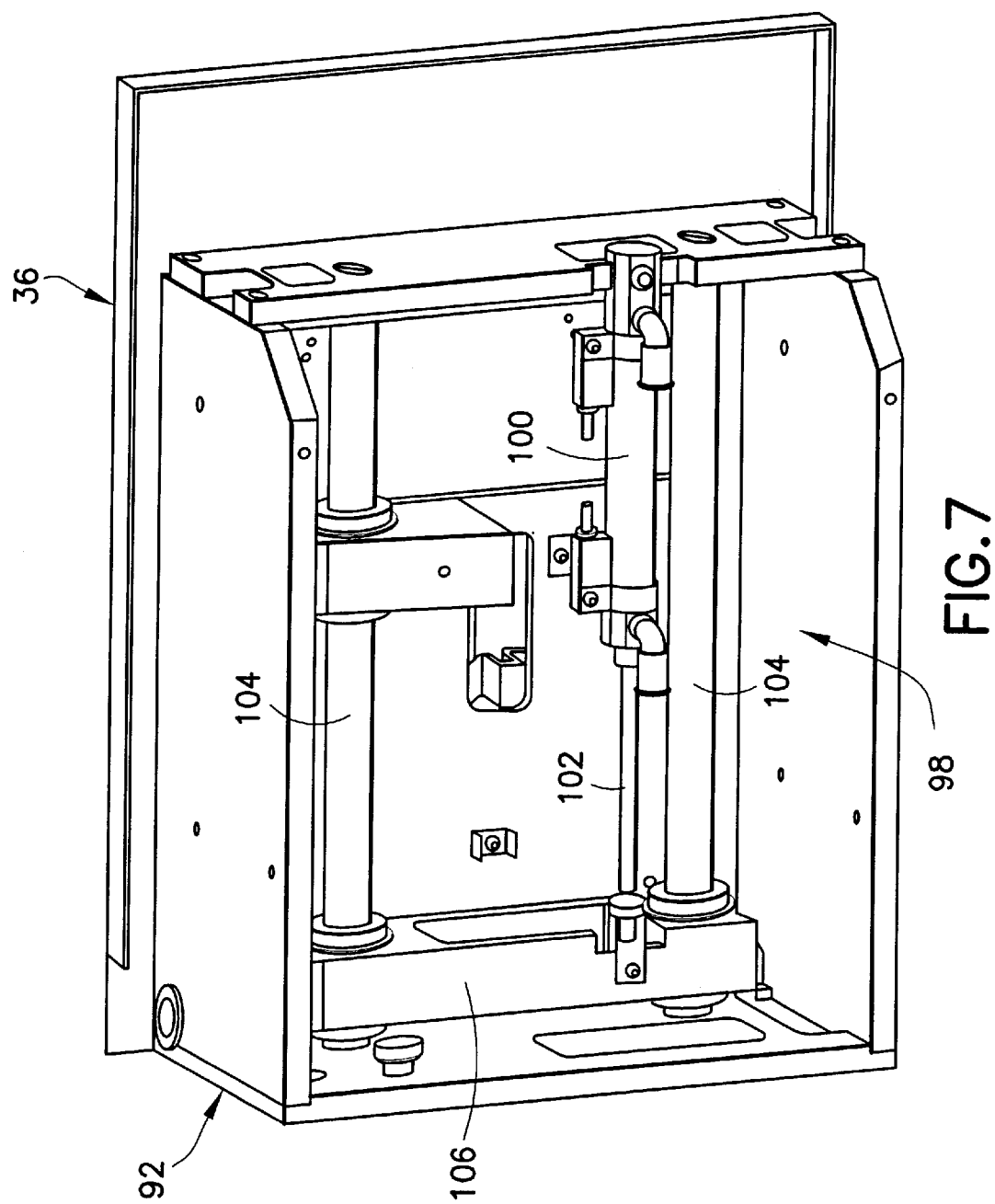

MATERIAL TRANSPORT SYSTEM

BACKGROUND OF THE INVENTION

1. Field of the Invention

The present invention relates to a loading and unloading station for semiconductor processing installations with a closeable charging opening through which wafer-shaped or disk-shaped objects which are accommodated in a transporting container can be loaded, unloaded and reloaded after removing a closure or through which a transporting container can be loaded or unloaded.

2. Description of the Prior Art

For the purpose of charging semiconductor processing installations, it is known to use so-called SMIF (Standard Mechanical Interface) boxes as magazine containers with a relatively small enclosed volume in which wafer magazines can be stored and transported. The box can be placed on an opening mechanism in an enclosure or housing which encloses one or more work stations so as to keep them free of dust. The box and opening mechanism have closing elements which are adapted to one another and which can be opened simultaneously one above the other so that dust particles resting on the outside of the closing elements can be enclosed therebetween when the wafer magazines are lowered into the housing together with the two closing elements. The box itself encloses the opening formed in the housing.

The SMIF(Standard Mechanical Interface) system was devised,, to reduce particle contamination by significantly reducing particle fluxes onto wafers. This end is accomplished by mechanically ensuring that during transport, storage and processing of the wafers, the gaseous media (such as air or nitrogen) surrounding the wafers is essentially stationary relative to the wafers and by ensuring that particles from the ambient outside environment do not enter the immediate internal wafer environment.

A loading and unloading device according to the German Patent 43 26 309 C1, for example, or a device having another operating sequence serves to remove the magazines from the transporting containers and place them in the processing installation. After the semiconductor wafers are processed, the magazines are transported back in the transporting containers.

The technique of SMIF boxes is especially suited for semiconductor wafers with smaller diameters, as is conventional. In view of the material characteristics of the semiconductor wafers, these SMIF boxes and the wafer magazines used with them are becoming increasingly unsuitable as transporting containers as the diameter of semiconductor wafers increases.

Transporting containers which take over the function of magazines at the same time are already known for semiconductor wafers of this type. Loading, unloading and reloading of the semiconductor wafers is effected individually in a plane parallel to the surface of the semiconductor wafers, wherein the transporting container can be closed by a container cover extending substantially at right angles to the loading and unloading plane. Accordingly, in contrast to the SMIF box, the container cover is removed and inserted laterally rather than in a downward direction.

Since the transporting containers are enclosed by a space with low requirements, as regards cleanness and since there are no magazines which can be loaded and unloaded such as those used in the SMIF technique, the charging of semiconductor processing installations proceeding from these transporting containers and the transporting back from such installations into the transporting containers presents problems. Moreover, the problem is exacerbated in that optional loading and unloading into and out of a greater number of transporting containers must be ensured under certain circumstances and the containers themselves must be supplied and removed by operating personnel under favorably ergonomic conditions.

An arrangement for storing, transporting and inserting substrates is known from EP 542 793 B 1. In this arrangement, a cassette with a lateral closing cap is arranged opposite a loading slot. The cassettes are brought into the loading position one after the other by a lifting plate which can hold a packet of stacked cassettes. When this position is reached, the closing cap is swiveled open at one edge and the substrate wafer is inserted into the clean room by a drawer which can travel out of the cassette. An air flow exiting from the loading slot prevents particles from penetrating into the clean room in that it passes through an open gap between a protruding seal and the cassette.

A significant improvement over the foregoing concepts has been presented in U.S. Pat. No. 5,772,386 to Mages et al., the entire disclosure of which is incorporated herein by reference.

Previous systems for semiconductor cassette and pod automated material handling systems (AMES) utilized over head transport technology (OHT) or guided vehicle technology. AMHS systems shuttle material to and from processing or inspection tools within the semiconductor fabricating facility.

OHT systems typically transport material with carts that proceed on tracks or rails mounted above tool charging openings or loading ports. Material is transferred from a cart and lowered onto and raised from the load ports utilizing a hoist mounted on the carts.

Guided vehicle systems typically transport material with vehicles that operate on the floor of the semiconductor fabricating facility. The guided vehicles proceed on rails mounted to the floor, follow slots formed in the floor, or are self guided typically by RF signals from wires embedded in the floor or via optical tape attached to the floor, or by dead reckoning, or by use of other suitable references. Material is transferred from the guided vehicle and lowered onto and raised from the loading ports utilizing a multi axis robot mounted on the guided vehicle.

It was with knowledge of the foregoing state of the technology that the present invention has been conceived and is now reduced to practice.

SUMMARY OF THE INVETION

The present invention relates to a system for loading and unloading semiconductor wafers. The system of the invention, which may be used adjacent a process tool having a reception region, includes a frame having a charging opening which may be in communication with the reception region of the process tool, a platform mounted on the frame and movable between a deployed position and a retracted position, and a movable closure for the charging opening for opening and closing a horizontal path through the charging opening. In the deployed position, the platform has a generally level, or horizontal, orientation adjacent the charging opening and projects away from the frame for receiving thereon a cassette adapted to support therein a plurality of the semiconductor wafers to be passed though the charging opening. In one embodiment, the platform is elevationally movable on the frame between a retracted lowered position distant from the charging opening and a deployed raised position adjacent the charging opening. In another embodiment, the platform is rotationally movable on the frame between the deployed position having a generally level orientation located generally adjacent the charging opening and the retracted position folded against the frame. The loading and unloading system includes a transport system for advancing a cassette from a remote location and delivering the cassette to the platform. The transport system includes a nest member for supporting a cassette at spaced apart locations enabling reception therebetween of the platform so that the cassette can selectively be transferred, in one instance, from the nest member to the platform and, in another instance, from the platform to the nest member.

As compared to known guided vehicle systems, the present invention eliminates the need for a multi-axis robot mounted on the guided vehicle and also reduces or eliminates the floor space needed at the tool in the fabrication facility for operation of the guided vehicle. The invention recognizes that floor space of a fabrication facility is very expensive. As compared to OHT systems, the present invention eliminates the need for a hoist. The AMHS system of the present invention utilizes guided vehicles which can operate on the floor space completely or at least partially below the tool loading ports or charging openings.

In a first embodiment, the frame encompassing the loading port is equipped with a tilt drive that allows the tool loading port's FOUP Front Opening Unified Pod) platform, or supporting surface, to be tilted from a level loading plane. As previously noted, for some time now, it has been known to employ transportable SMIF boxes, containers, or carriers, for maintaining articles, such as semiconductor wafers, clean. This has been achieved by maintaining within each carrier a substantially particle free environment while the wafers are being brought to, or removed from, the process tool. Previously, it was customary to carry a large number of the wafers within the carrier by supporting them in a spaced relationship by means of a cassette. Using this technique, the cassette would be loaded with a supply of wafers, transported into the carrier, then subsequently wafers would be removed from the cassette within the carrier one by one for placement in a load lock or the cassette would be transferred with the wafers within the clean mini-environment existing between the carrier, SMIF box, or the like, and the wafer processing equipment. The SMIF box was a bottom loading design and generally was used to carry substrates sized to a diameter of 200 mm. More recently, carriers are of the FOUP design intended to carry substrates sized to a diameter of 300 mm.

Returning now to a discussion of the AMHS system of the present invention, the guided vehicle is equipped with a lift fitted with a nest member for supporting the FOUP when the FOUP is being transported about the fabrication facility. To load a FOUP from the guided vehicle to the loading port, the following steps are performed.

(a) the platform, or FOUP supporting surface, but without a FOUP, is tilted to a retracted position;

(b) the guided vehicle with a nest supporting the FOUP during transit is positioned at the loading port;

(c) the nest now supporting the FOUP is raised to a level of a loading plane at the charging opening;

(d) the platform, or FOUP supporting surface, is tilted to the horizontal loading plane; and (e) with the nest and the platform proximately and interdigitally positioned, the nest is lowered thereby transferring the FOUP to be supported on the platform and the nest without the FOUP thereon continues to be lowered. Steps (a) and (b) can be performed simultaneously. Unloading the FOUP from the platform and transferring it to the nest requires an opposite sequence of steps.

In a second embodiment, the frame encompassing the loading port is equipped with a lift drive that allows the tool loading port's FOUP platform, or supporting surface, to be lowered from the horizontal loading plane. The guided vehicle is equipped with a nest member including a pair of spaced forks for supporting the FOUP when the FOUP is being transported about the fabrication facility. When the lift drive is in the lowered position, the loading port's FOUP supporting surface, or platform, is located elevationally below the forks. To load a FOUP from the guided vehicle to the loading port the following steps are performed:

(a) the platform, or anticipated FOUP supporting surface is lowered or already at the lowered position;

(b) the guided vehicle is located at the loading port;

(c) the nest with the FOUP supported thereon is raised; and (d) the guided vehicle is removed from the loading port.

To unload a FOUP from the loading port and return it to the guided vehicle, the following steps are performed:

(a) the guided vehicle is positioned at the loading port;

(b) the nest with the FOUP thereon is lowered;

(c) the guided vehicle is removed from the loading port;

(d) the lift is raised or left at a lowered position.

A primary feature, then, of the present invention is the provision of a loading and unloading system for semiconductor processing installations with a closeable charging opening through which wafer-shaped or disk-shaped objects which are accommodated in a transporting container can be loaded, unloaded and reloaded after removing a closure or through which a transporting container can be loaded or unloaded.

Another feature of the present invention is the provision of such a system incorporating a platform mounted on a frame encompassing the charging opening, the platform being movable between a deployed position and a retracted position, the platform in the deployed position having a generally level orientation adjacent the charging opening and projecting away from the frame for receiving thereon a cassette adapted to support therein a plurality of the semiconductor wafers.

Still another feature of the present invention is the provision of such a system in which the platform includes a shuttle stage and a cassette mount having an upper surface for receiving the cassette thereon when the platform is in the generally level orientation reciprocally mounted on the shuttle stage with the cassette thereon in plane between a withdrawn position distant from the charging opening and an advanced position proximate the charging opening.

Yet another feature of the present invention is the provision of such a system in which the platform is rotationally movable on the frame between the deployed position having a generally level orientation located generally adjacent the charging opening and the retracted position folded against the frame.

Still a further feature of the present invention is the provision of such a system in which a transport system is employed for advancing a cassette containing a plurality of semiconductor wafers from a remote location and delivering the cassette onto the platform when in a generally level orientation.

Yet a further feature of the present invention is the provision of such a system wherein the transport system includes a nest member for supporting a cassette at spaced apart locations enabling reception therebetween of the platform in the deployed position so that the cassette can selectively be transferred, in one instance, from the nest member to the platform and, in another instance, from the platform to the nest member.

Other and further features, advantages, and benefits of the invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention, illustrate one of the embodiments of the invention, and together with the description, serve to explain the principles of the invention in general terms. Like numerals refer to like parts throughout the disclosure.

BRIEF DESCRIPTION OF THE DRAWINGS

The foregoing aspects and other features of the present invention are explained in the following description, taken in connection with the accompanying drawings, wherein:

FIGS. 4A–4D are side elevation views illustrating successive operational positions of components illustrated in FIGS. 3A–3H;

FIG. 7 is a perspective view of the underside of the cassette platform illustrated in FIG. 7;

DETAILED DESCRIPTION OF THE PREFERRED EMBODIMENTS

Figure 1:
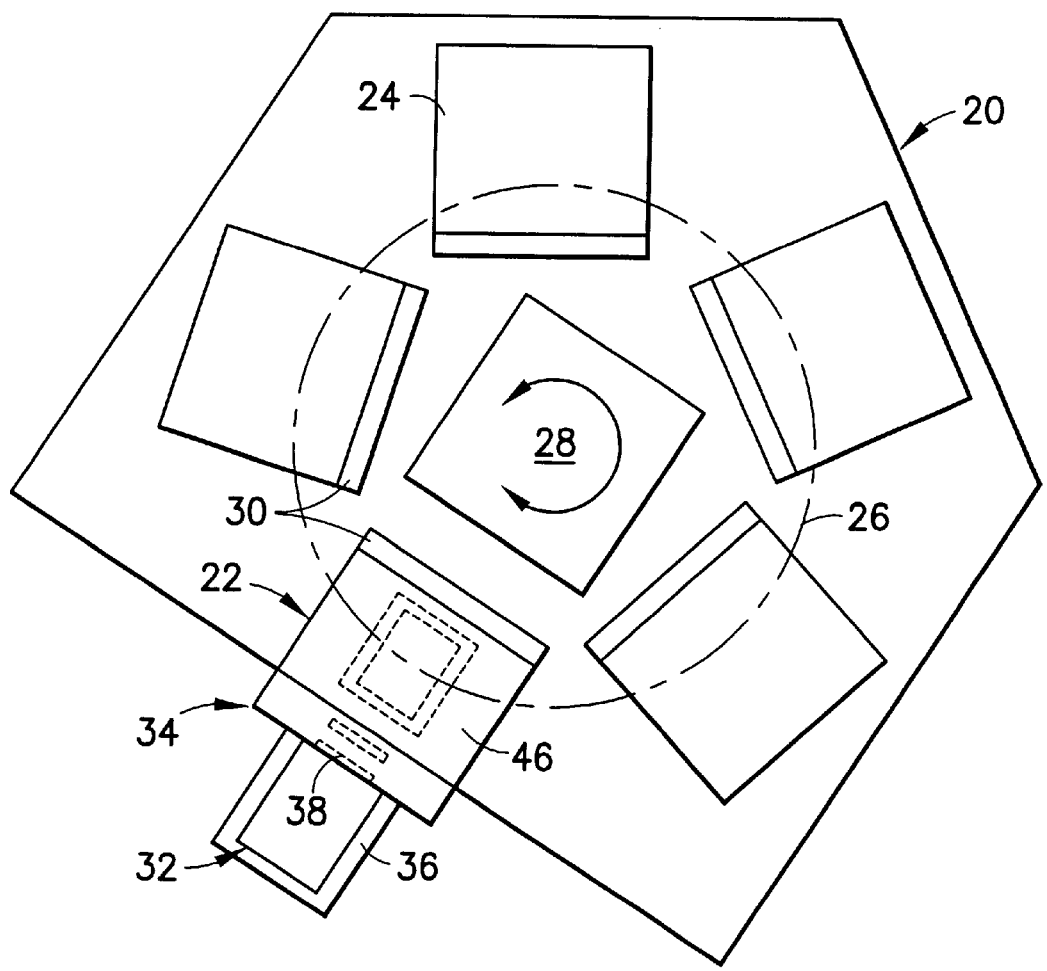
FIG. 1 is a top plan diagrammatic view of a wafer processing system of the type which can utilize the present invention.

Referring initially to FIG. 1, there is shown a top plan view of a process tool 20 incorporating features of the present invention for operating on semiconductor wafers. Although the present invention will be described with reference to the embodiments shown in the drawings, it should be understood that the present invention can be embodied in many alternate forms of embodiments. In addition, any suitable size, shape or type of elements or materials could be used.

As illustrated, the process tool 20 includes a load lock 22 or reception region 46 for initially receiving wafers to be processed and a plurality of single-wafer processing stations 24 for operations on the surfaces of the wafers such as imaging, plasma etching, and the like. It is typical for the processing stations 24 to be arranged about a closed locus as indicated by a dashed line 26. A transport chamber 28 is disposed concentrically within the load lock 22 and processing stations 24 for singly transferring wafers to be processed and after processing between the load lock and one or more of the processing stations 24. A plurality of isolation valves 30 are individually provided at the interfaces of the several processing stations 24 and the transport chamber 28 and between the load lock 22 and the transport chamber 28.

According to the invention, a modified portable carrier 32 of the FOUP design is provided for supporting and transporting a plurality of wafers (not shown) in spaced relationship in a substantially particle free environment. In a customary fashion, the carrier has a plurality of rack members for supporting the wafers generally horizontally in a vertically spaced relationship. Also, according to the invention, an isolation housing or mini-environment 34 is provided for sealingly isolating the load lock 22 or reception region 46 and the interior of the carrier 32 from the surrounding atmosphere and for transferring wafers into the process tool. The carrier is brought in some suitable fashion to be described from a remote location, then placed on a platform 36 mounted on a frame 38 which may be a part of the mini-environment 34 and projects in a direction away from the process tool 20. Notwithstanding the preceding description, it will be appreciated that the platform 36 and the frame 38 may be associated with a wide range of apparatuses other than the apparatus described.

Turn now initially to FIGS. 2, 3A–3H, and 4 for the description of a first embodiment of the invention, specifically, a system 40 for loading and unloading cassettes, or carriers, 32 which are adapted to support a plurality of semiconductor wafers in a protected atmosphere. The system 40 includes the frame 38 which has a charging opening 44. As noted above, the system 40 may be positioned adjacent the process tool 20 with a reception region 46, the charging opening of the frame 38 being in communication with the reception region of the process tool. However, the process system 40 may also be used in combination with numerous other types of equipment.

The platform 36 is mounted on the frame 38 and movable between a deployed position (FIG. 4A) and a retracted position (FIG. 4D), FIGS. 4B and 4C illustrating intermediate positions. In the deployed position, the platform 36 has a generally level orientation adjacent the charging opening 44 and projects away from the frame 38 for receiving thereon a cassette 32. A movable closure 48 (FIG. 2) is provided for opening and closing a horizontal path through the charging opening 44. The movable closure 48 may incorporate a mechanism for latching and unlatching the door of a transporting container. Additionally, a transport system 50 is provided for transporting a cassette 32 containing a plurality of semiconductor wafers from a remote location and delivering the cassette to the platform 36 when in a generally level orientation and, subsequently, for removing the cassette from the platform and delivering it to a remote location.

In this embodiment, the platform 36 is rotationally movable about a laterally extending axis 51 (FIG. 5) on the frame 38 between the deployed position (FIGS. 3A, 3B, 3E–3H, and 4A) having a generally level orientation located generally adjacent the charging opening and the retracted position (FIGS. 3C, 3D, and 4D) folded against the frame.

Figure 5:
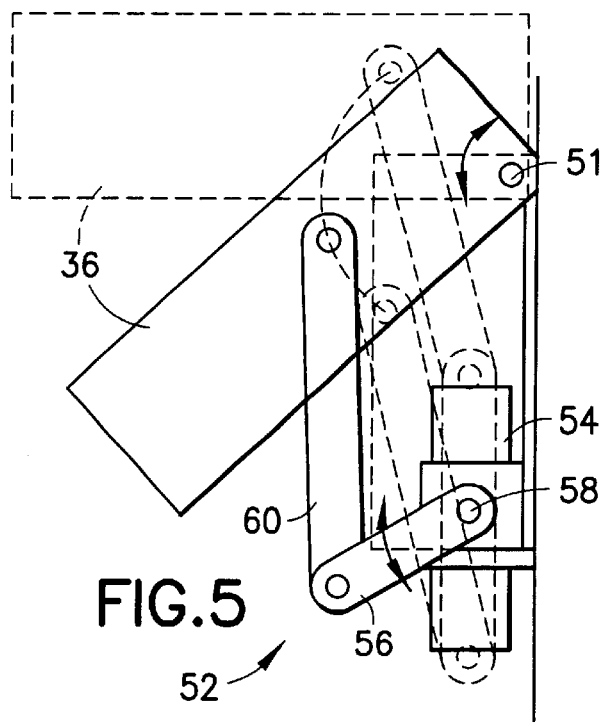
FIG. 5 is a detail side elevation view of components illustrated in FIGS. 4A–4D.
Figure 6:
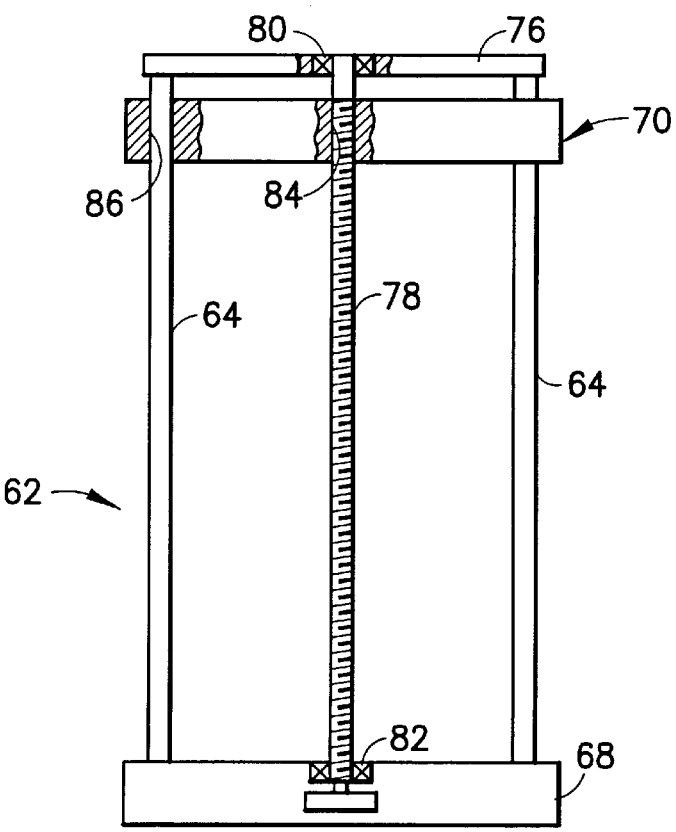
FIG. 6 is a detail front elevation view of a portion of a guided vehicle utilized by the invention.

As seen especially well in FIG. 5, an actuating mechanism 52 is employed for moving the platform 36 between the deployed position (dashed lines) and the retracted position (center lines) through an intermediate position (solid lines). The actuating mechanism 52 may include a rotary actuator 54; a drive link 56 driven by the rotary actuator about a drive axis 58 parallel to and spaced from the rotational axis 51 of the platform 36; a connecting link 60 pivotally connected at opposed ends, respectively, to the platform at a position spaced from the rotational axis 51 and to the drive link at a position spaced from the drive axis.

By reason of the construction just described, the actuating mechanism 52 is effective to move the platform 36 through an arcuate sweep of 90° between the deployed and retracted positions in response to rotation of the drive link 56 through an arcuate sweep of 180°. Of course it will be appreciated that the arcuate sweeps of the platform and of the drive link may be of different angular values. Also, the actuating mechanism 52 may alternatively be constructed using other rotary actuators, linear to rotary actuators, or linkages available to those skilled in the art. In any event, this operation provides a sinusoidal acceleration/deceleration through the tilt motion using an essentially constant speed drive without the need for servo controls. This results in a particularly smooth operation sequentially depicted by FIGS. 4A, 4B, 4C, and 4D.

The earlier mentioned transport system 50 includes a guided vehicle 62 with a vehicle drive system, a suitable example of which is manufactured by Magnemotion Inc. of Sudbury, Mass. USA. The guided vehicle may be mounted on a track 66 situated to enable its movement from the remote location to a location adjacent the frame 38 and, more specifically, adjacent the charging opening 44. Alternatively, the track may be eliminated with the guided vehicle being otherwise guided to move between the remote location and the location adjacent the frame 38.

In a typical design, a pair of upright parallel spaced apart elevator rods 64 are mounted on a base housing 68 of the guided vehicle. A nest member 70 is mounted for vertical movement on the elevator rods 64, the nest member including a pair of parallel lifting forks 72 transversely projecting from a bight 74. The guided vehicle 62 also includes a cross member joining upper ends of the elevator rods 64 and an upright drive screw 78 extends between upper and lower ends intermediate the pair of elevator rods. The drive screw 78 is rotatably mounted by means of upper and lower bearings 80, 82, respectively, for rotation about a longitudinal axis, the lower bearing being mounted on base housing 68, the upper bearing being mounted on the cross member 76. A suitable drive motor is provided within the base housing for rotating the upright drive screw. Additionally, the bight 74 of the nest member 70 has a tapped bore 84 threadedly engaged with the upright drive screw 78 and a pair of spaced apart clearance bores 86 for slidably receiving the elevational slides, respectively, such that rotation in one direction of the upright drive screw causes the nest to be raised and such that rotation in an opposite direction of the upright drive screw causes the nest to be lowered.

The lifting forks 72 are spaced by a dimension slightly greater than spacing between opposed side surfaces 88 of the platform 36 such that when the nest member 70 is laterally aligned with the platform (generally left to right viewing FIGS. 3A–3H) and raised to a level coplanar with the platform, the lifting forks are coextensive with the side surfaces 88 and the bight 74 is generally proximate a front surface 90 of the platform. The transfer of the cassette 32 between the nest member 70 and the platform 36 is enabled when the nest member is either raised above the plane of the platform or lowered below the plane of the platform. Thus, when the nest member is raised above the plane of the platform, a cassette previously supported on the platform is transferred to the nest member and when the nest member is lowered below the plane of the platform, a cassette previously supported on the nest member is transferred to the platform.

Figure 2:
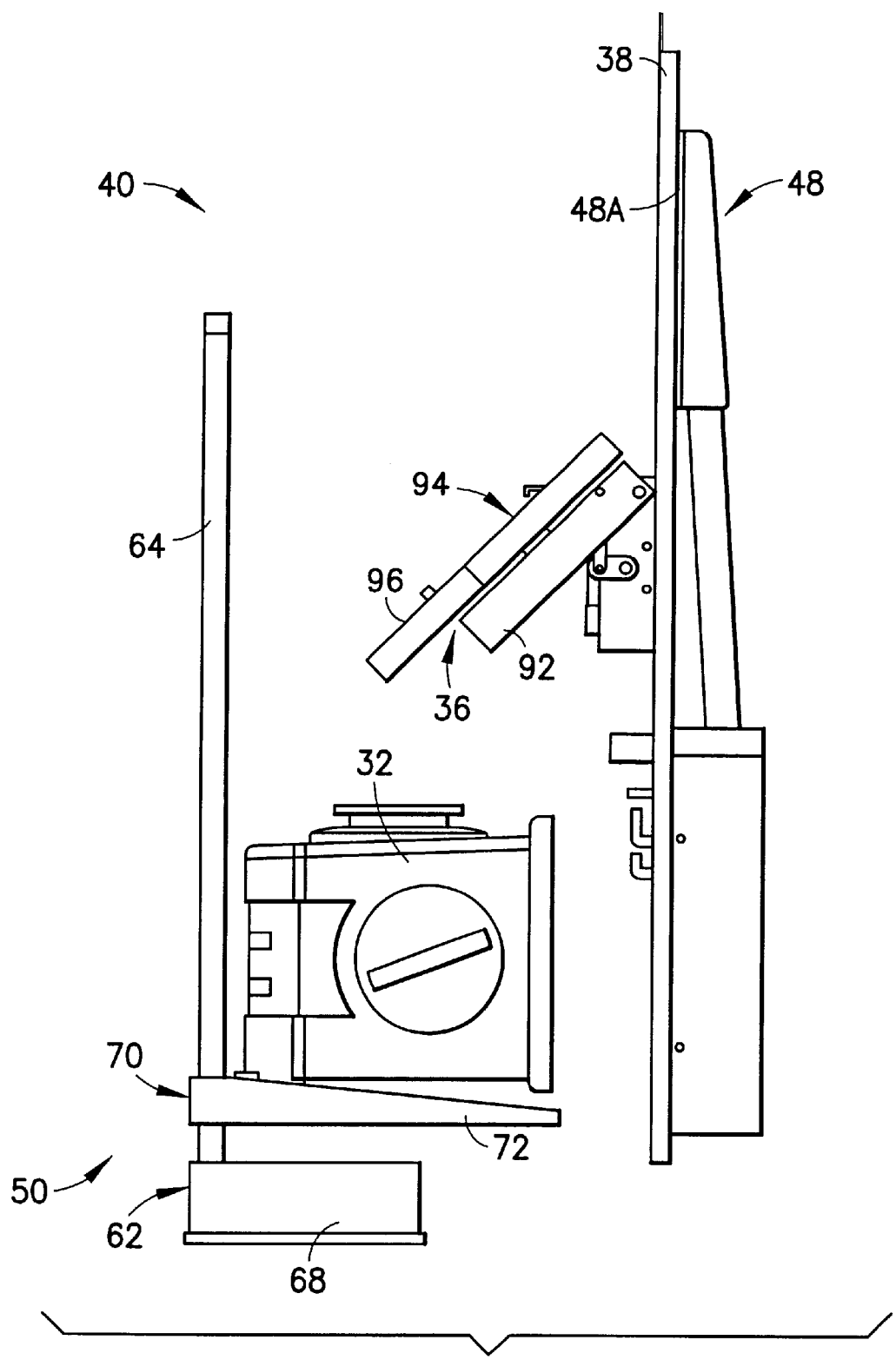
FIGS. 2 and 2A are side elevation views of a frame of a loading and unloading station embodying the present invention and depicting different positions, respectively, of operating components.

Viewing FIG. 2, the platform 36 is seen to include a shuttle stage 92 and a cassette mount 94 having an upper surface 96 for receiving the cassette thereon when the platform is in the generally level orientation. The cassette mount 94 is reciprocably mounted on the shuttle stage 92 with the cassette 32 thereon in plane between a withdrawn position distant from the charging opening 44 and an advanced position proximate the charging opening. An actuating mechanism 98 for moving the platform between the withdrawn position and the advanced position is illustrated in FIG. 7. The actuating mechanism 98 includes a platform actuator 100 mounted on the shuttle stage 92 and has an actuator rod 102 fixed to the platform at a location distant from the platform actuator for moving the platform between the withdrawn position distant from the charging opening and the advanced position proximate the charging opening. A pair of parallel guide rods 104 fixed on the shuttle stage 92 slidably engage with a double bored guide sleeve 106 integral with the platform 36 to assure proper directional movement of the platform as it moves between the advanced and withdrawn positions.

Turn now to FIGS. 8A–8D and 9 for the description of another embodiment of the invention. In this instance, a modified platform 36A is elevationally movable on a modified frame 38A between a retracted lowered position (FIG. 8A) distant from the charging opening 44 and a deployed raised position (FIG. 8D) adjacent the charging opening. As seen especially well in FIG. 9, an elevational transporter mechanism 108 is provided on the frame 38A for moving the platform elevationally between the retracted lowered position and the deployed raised position. The elevational transporter mechanism 108 includes a pair of upright parallel spaced apart elevational slides 110 mounted on the frame 38A. An upright drive screw 112 is mounted on the frame using upper and lower bearings 114, 116, respectively, intermediate the pair of elevational slides 110 for rotation about a longitudinal axis. A motor 118 or other suitable drive mechanism is mounted on the frame 38A for rotating the upright drive screw 112. The platform 36A has a tapped bore 120 threadedly engaged with the upright drive screw 112 and a pair of spaced apart clearance bores 122 for slidably receiving the elevational slides 110, respectively, such that rotation in one direction of the upright drive screw causes the platform to be raised and such that rotation in an opposite direction of the upright drive screw causes the platform to be lowered.

Of course it will be appreciated that the elevational transporter mechanism 108 may alternatively be constructed using other, linear actuators, or linkages, available to those skilled in the art.

Figure 8A:
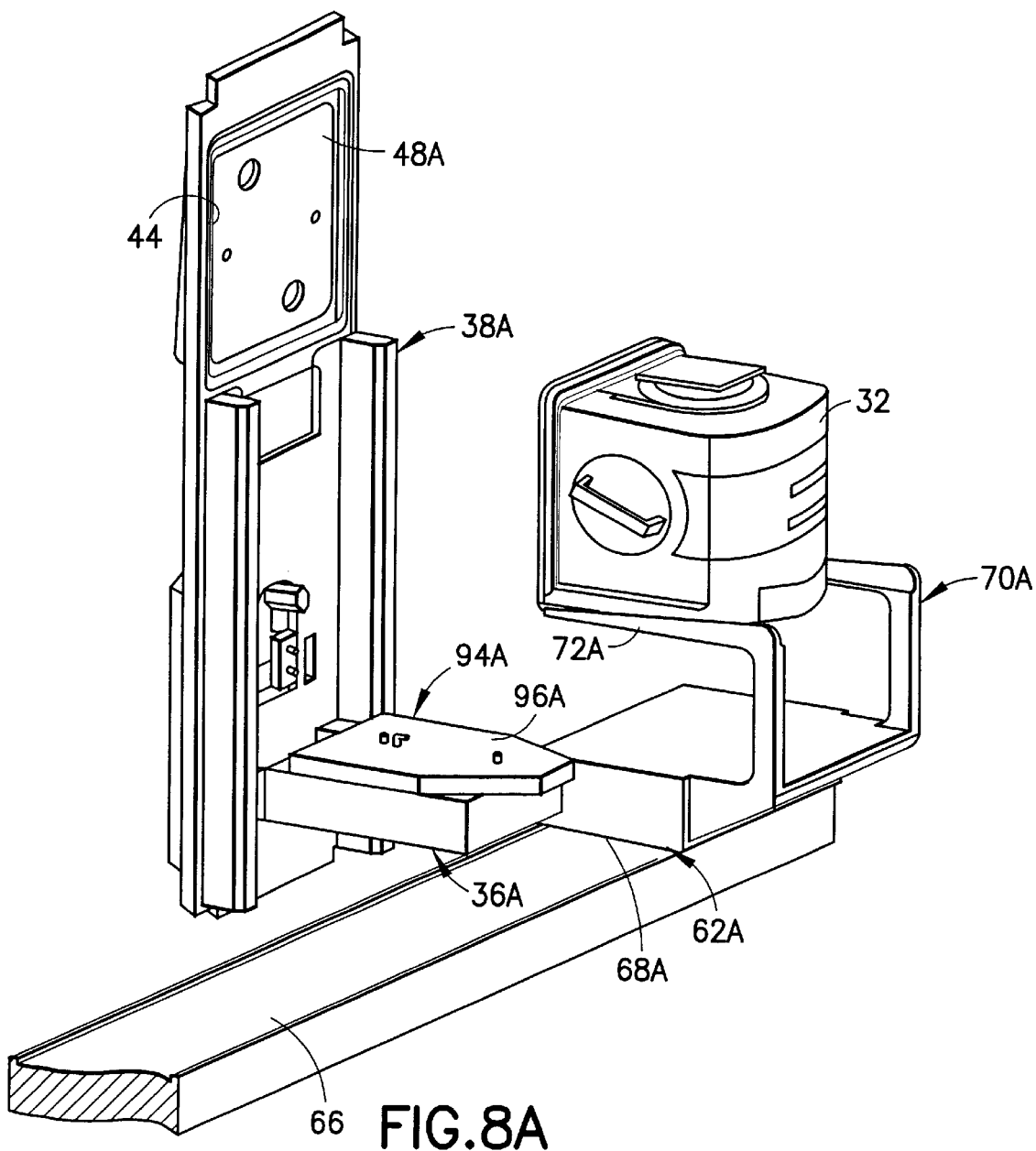
FIGS. 8A–8D are perspective views illustrating successive operational positions of components comprising another embodiment of the invention.
Figure 8B:
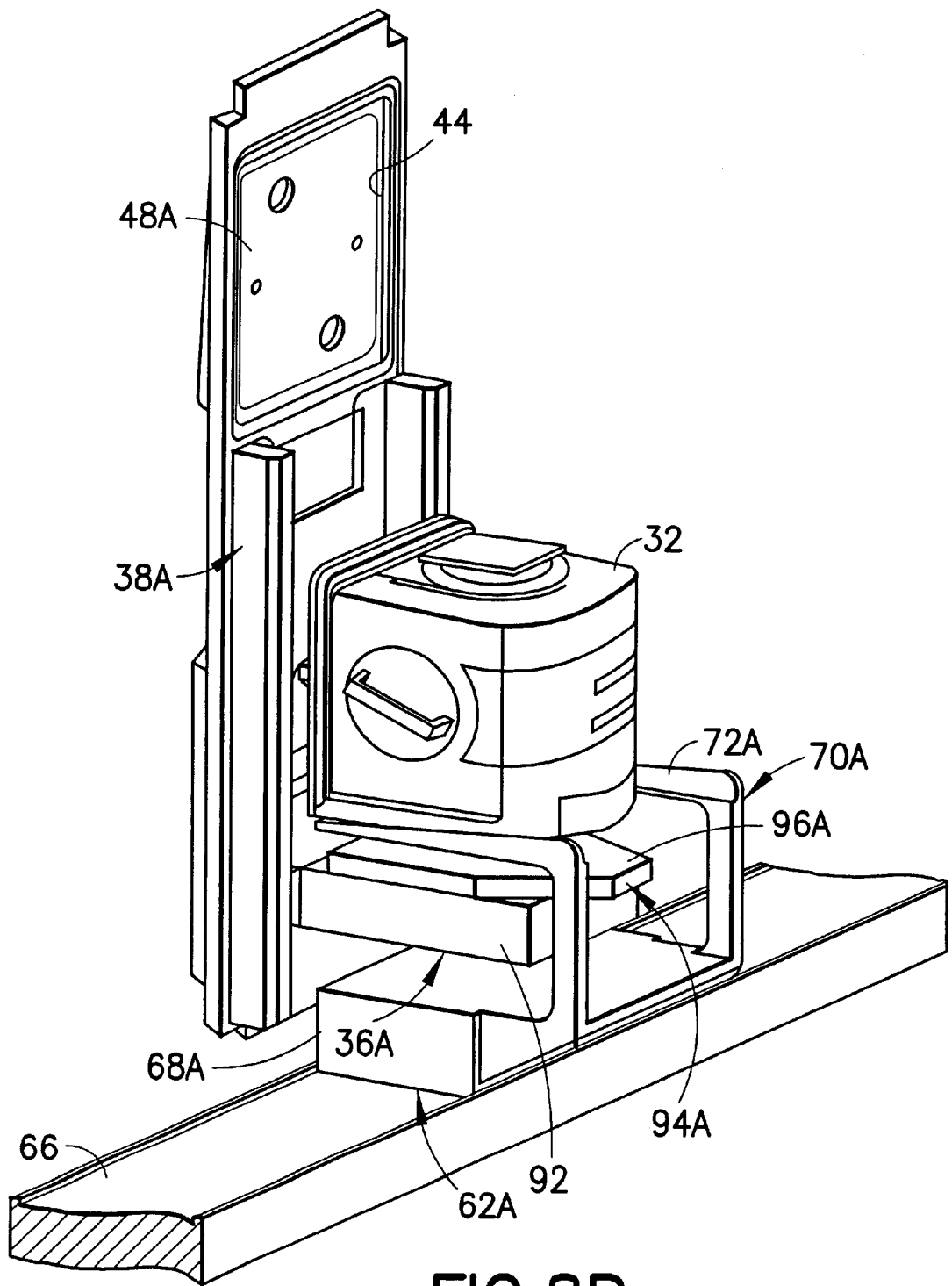
Figure 8C:
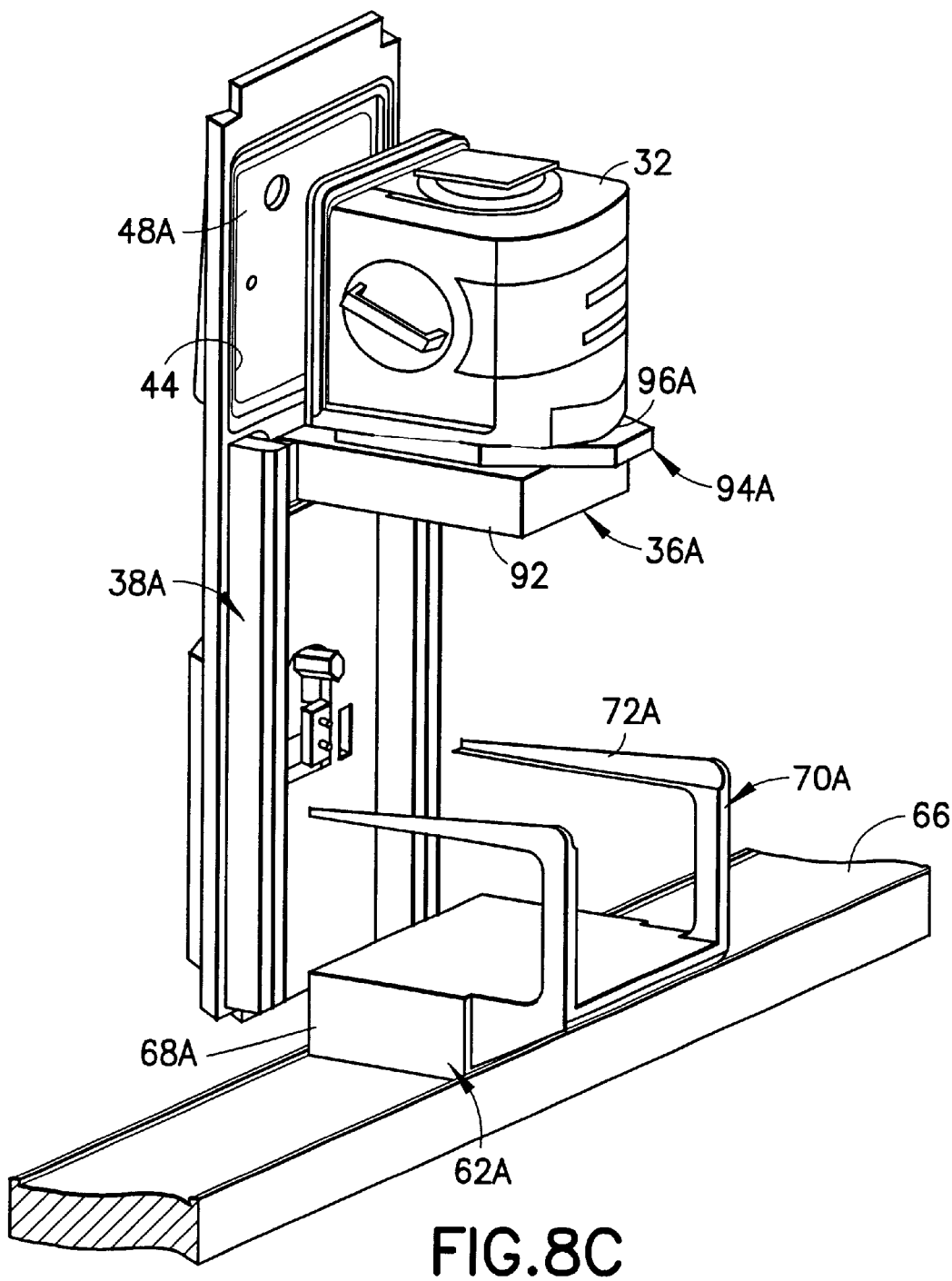
Figure 8D:
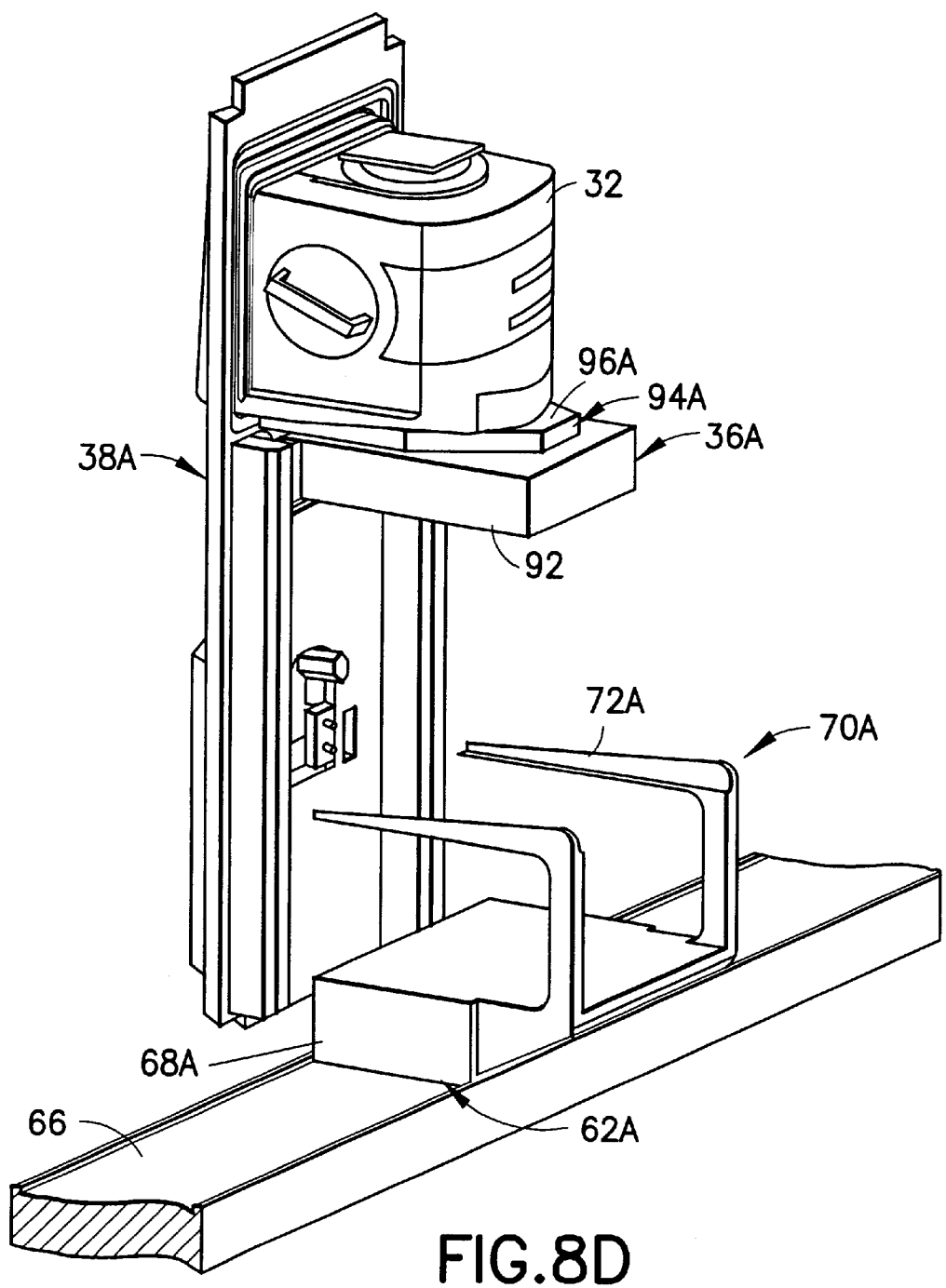
Figure 9:
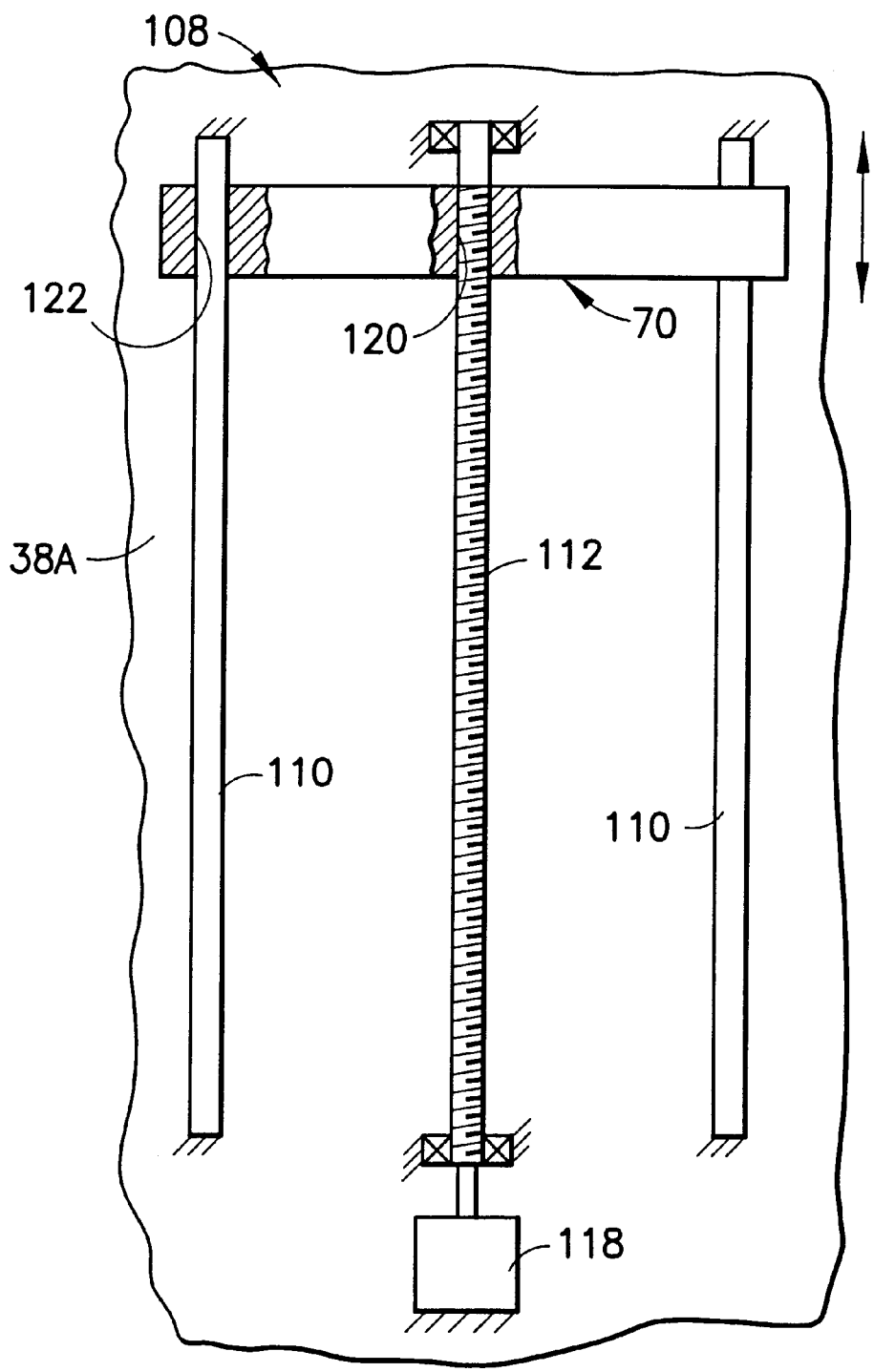
FIG. 9 is a detail front elevation view of an operating mechanism for one embodiment of the invention.

In this instance, viewing FIG. 8D, the cassette 32 is positioned on the platform 36 proximate the frame 38A in a contiguous relationship with the charging opening 44 even as the modified guided vehicle 62A is laterally aligned on the track 66 with the cassette and platform. Unlike in the prior embodiment, in this instance, the guided vehicle includes a modified nest member 70A again including a pair of modified parallel transversely projecting lifting forks 72A. The lifting forks 72A are spaced by a dimension slightly greater than spacing between the side surfaces of the platform such that when the nest member is laterally aligned with the platform the lifting forks are coextensive with the side surfaces, the transfer of the cassette between the nest member and the platform is enabled. However, the lifting forks are fixed to a modified base housing 68A of the guided vehicle 62A and do not elevate as in the earlier embodiment.

When the platform 36A supporting the cassette 32 is in the lowered position (FIG. 8A), the upper surface 96A has an elevation lower than that of the lifting forks 72A. Thereupon, the guided vehicle 62A is moved laterally until the nest member 70A is laterally aligned with the platform 36A and cassette 32 (FIG. 8B). The platform 36A is then raised, lifting the cassette 32 from the nest member, continuing to elevate until the cassette is elevationally aligned with the charging opening 44 (FIG. 8C). Thereupon, the cassette is moved toward the frame 38A until it is in a contiguous relationship aligned with the charging opening 44.

Figure 10:
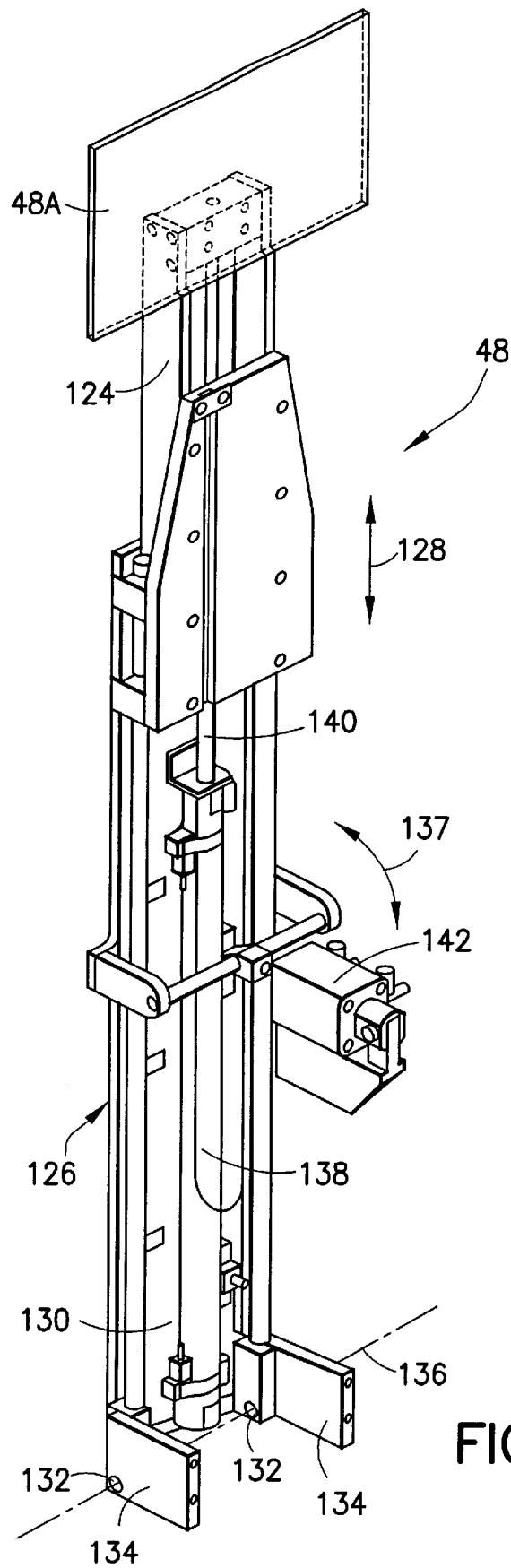
FIG. 10 is a rear elevational view of a frame with a charging opening and provided with a movable closure for opening and closing a horizontal path through the charging opening.
Figure 11:
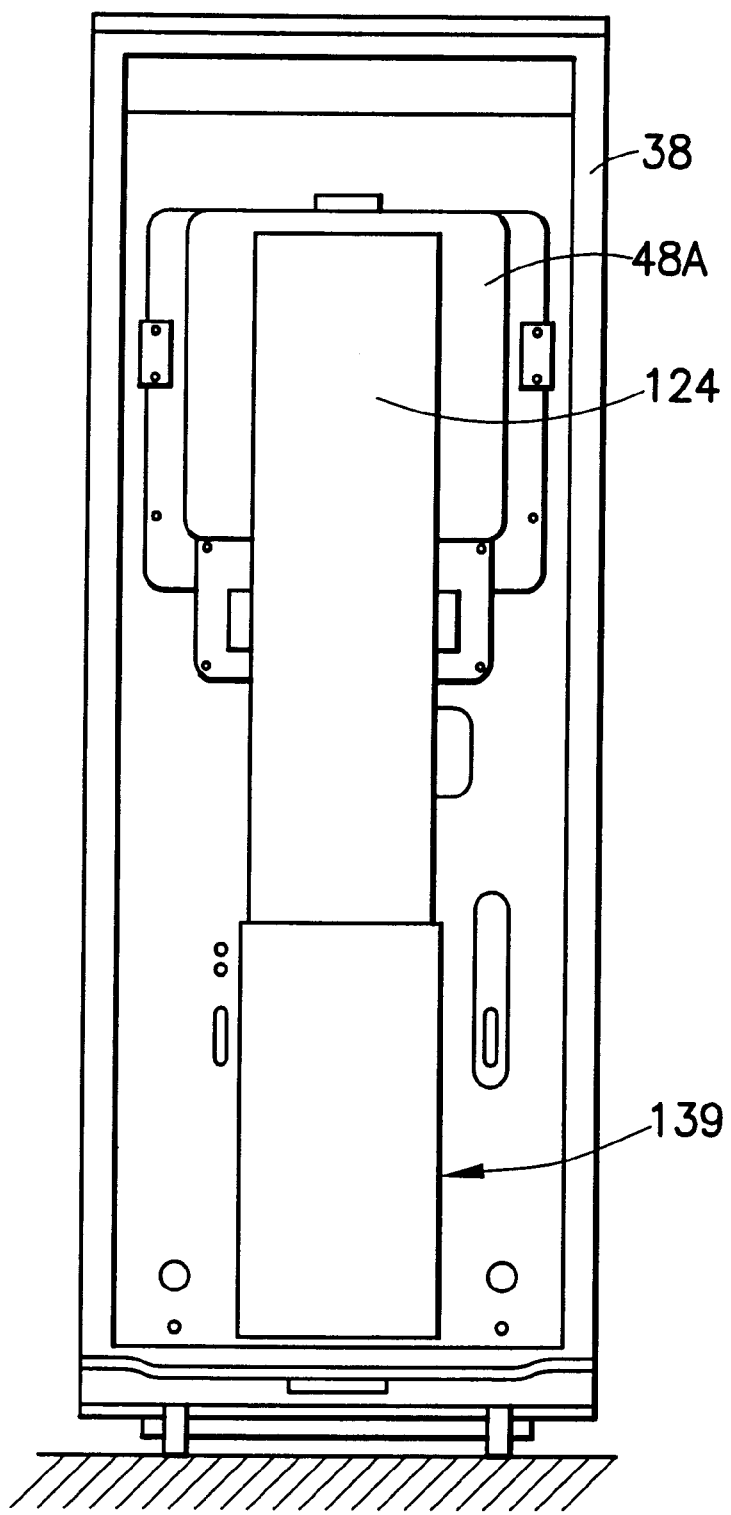
FIG. 11 is a detail perspective view of components illustrated in FIG. 11.

It was earlier mentioned with respect to FIG. 2 that a movable closure 48 is provided with the system 40 for opening and closing a horizontal path through the charging opening 44. A brief description will now be provided of a suitable mechanism for this purpose, turning now to FIGS. 2A, 10, and 11. The frame 38 includes an arm 124 (FIG. 10) on which is mounted the closure 48. The arm 124 is operable to move the closure 48 between the positions depicted, respectively, in FIGS. 2 and 2A. Indeed, the arm 124 is movable in at least two different directions angled relative to each other so as to move the closure in the at least two different directions. More specifically, in one instance, the arm 124 is slidably movable longitudinally on an upright column 126 in up and down directions as indicated by a double headed arrow 128. With this construction, it can be said that the arm is longitudinally movably connected to the frame 38.

Additionally, a base 130 of the column 126 is pivotally hinged as at pivot locations 132 to block members 134 which, in turn, are suitably fastened to the lower regions of the frame 38. With this construction, in another instance, the arm 124 can be said to be rotatably connected to the frame 38 and this construction enables the arm to pivot about a laterally directed axis 136 in the manner generally depicted by a double headed arrow 137.

Figure 2A:
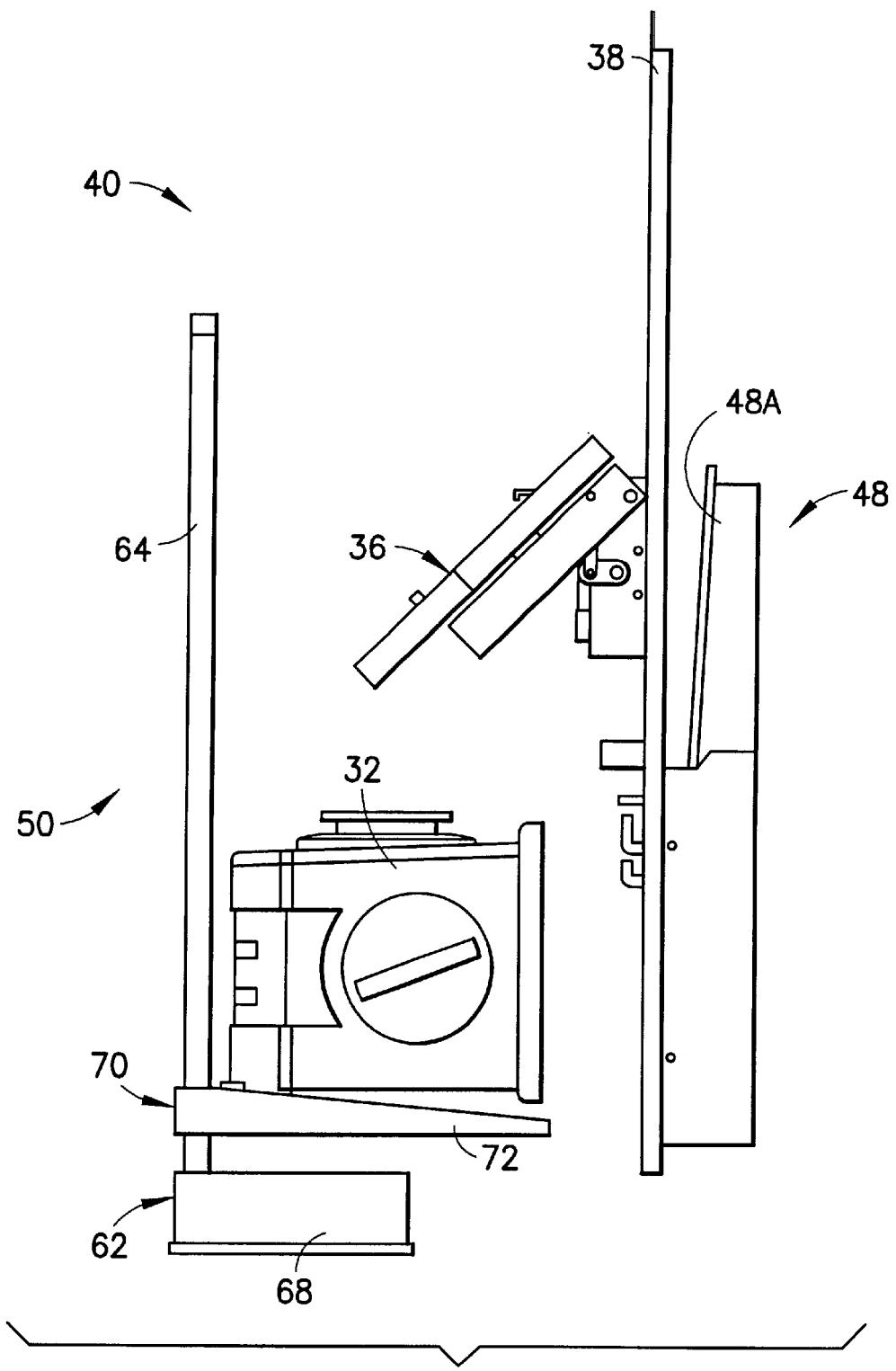
Figure 3A:
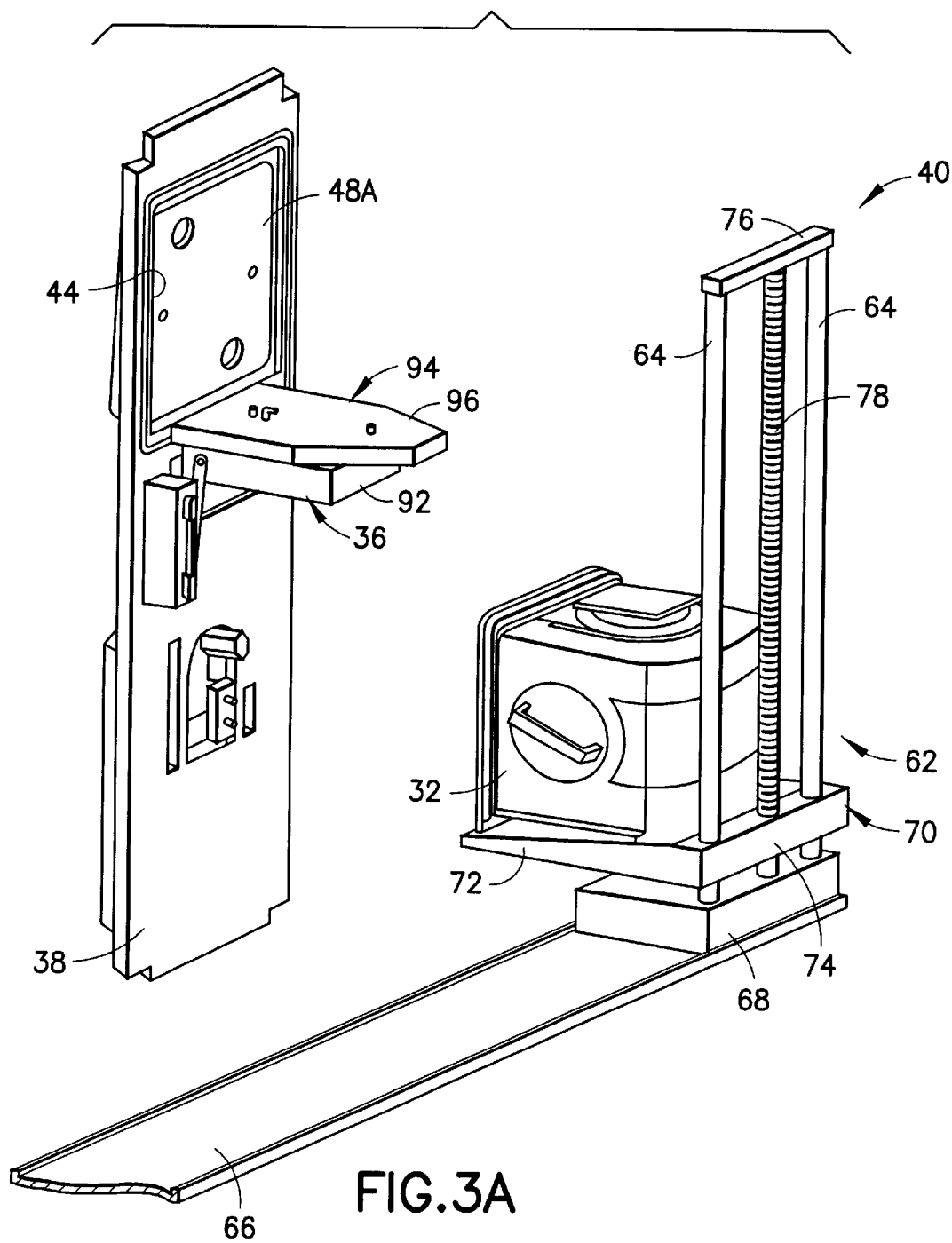
FIGS. 3A–3H are perspective views illustrating successive operational positions of components comprising one embodiment of the invention.
Figure 3B:
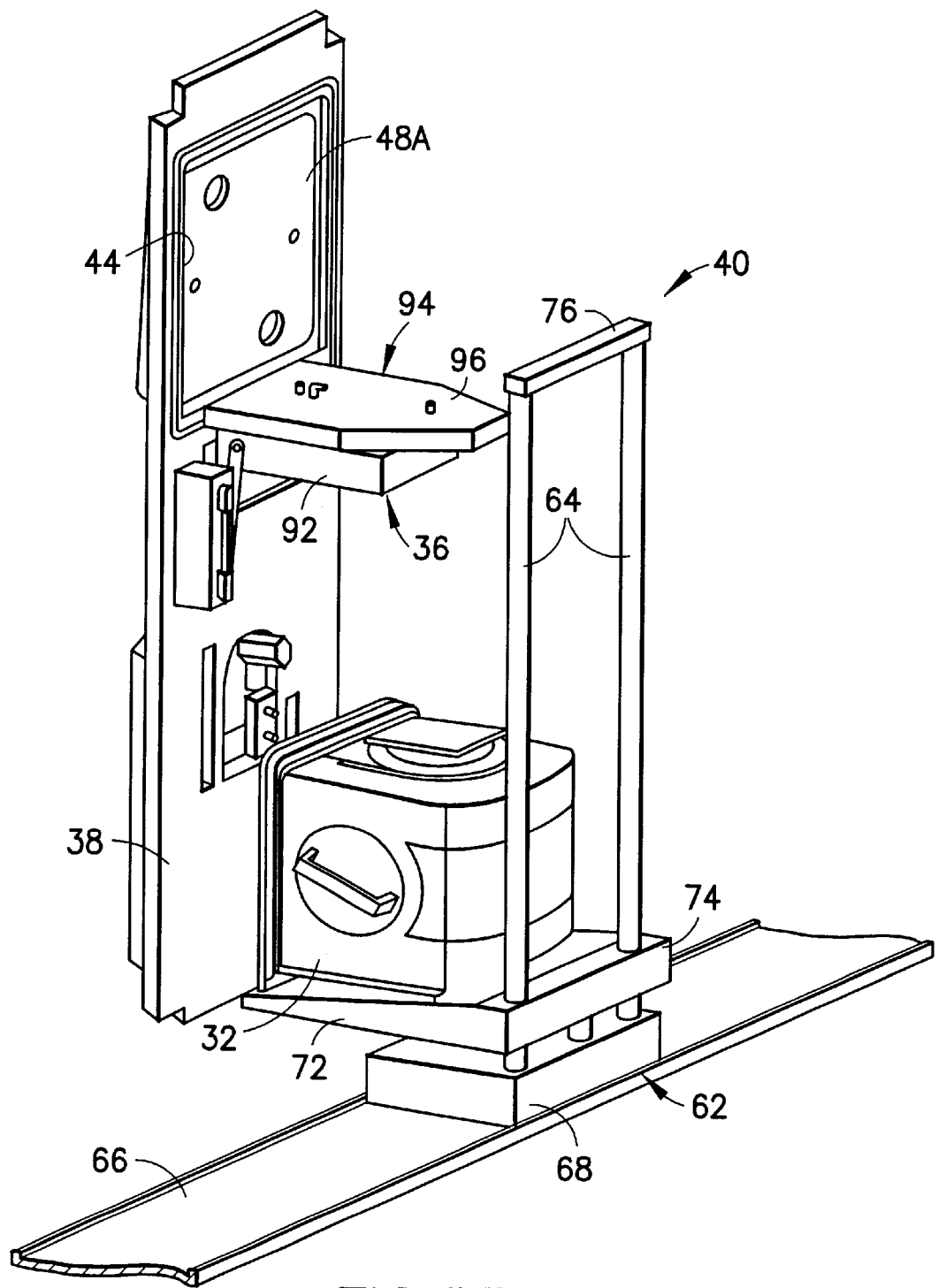
Figure 3C:
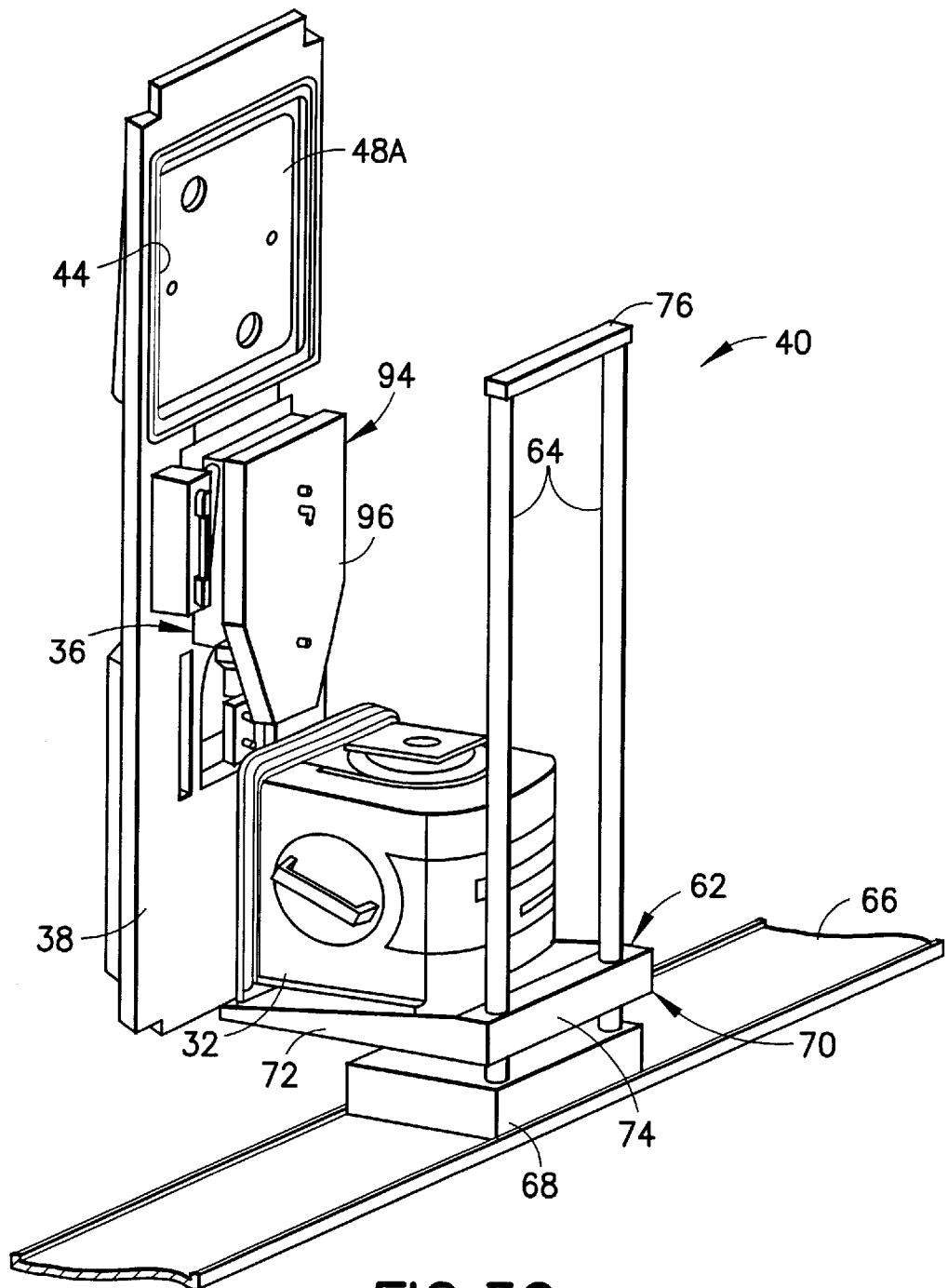
Figure 3D:
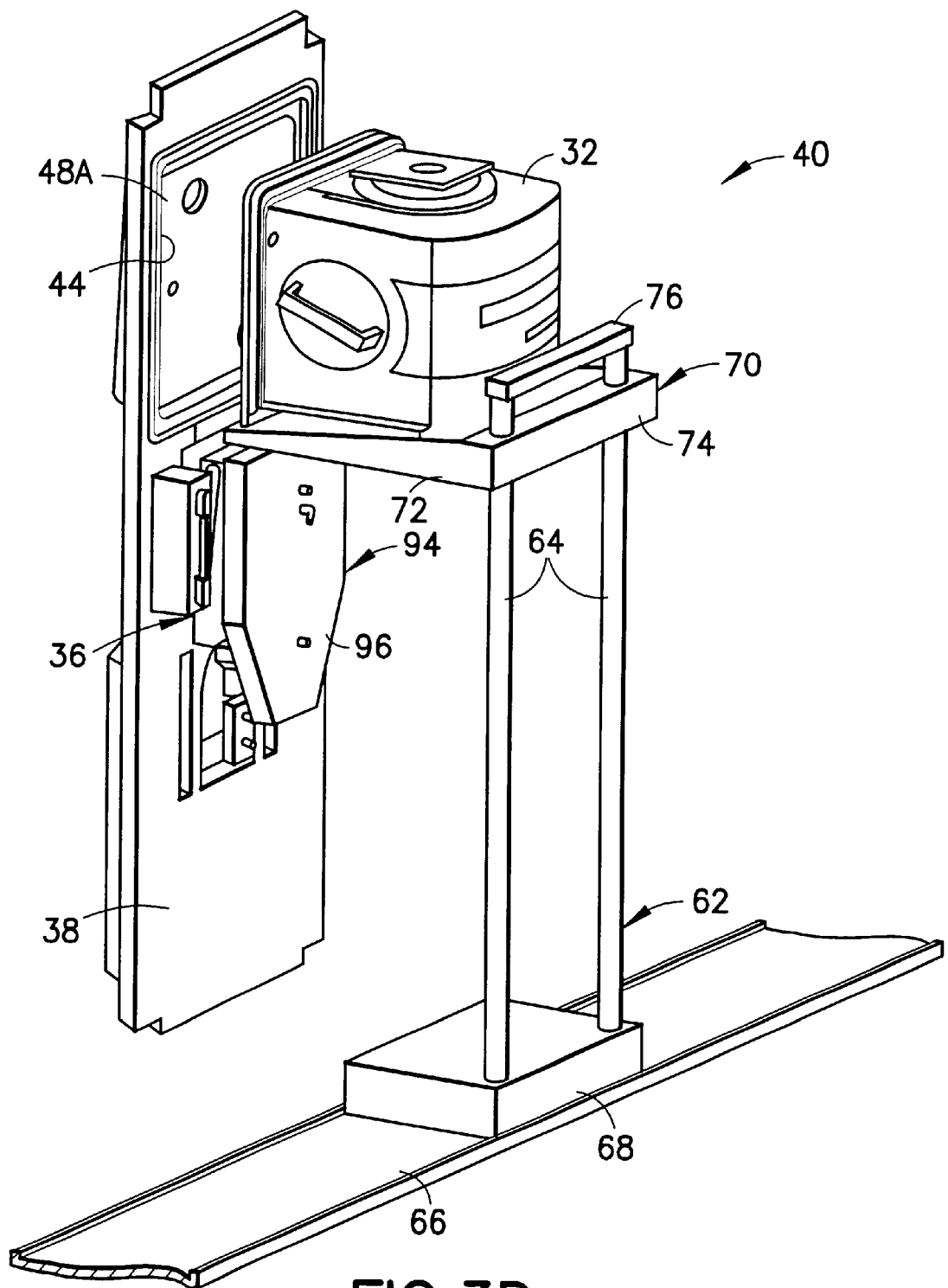
Figure 3E:
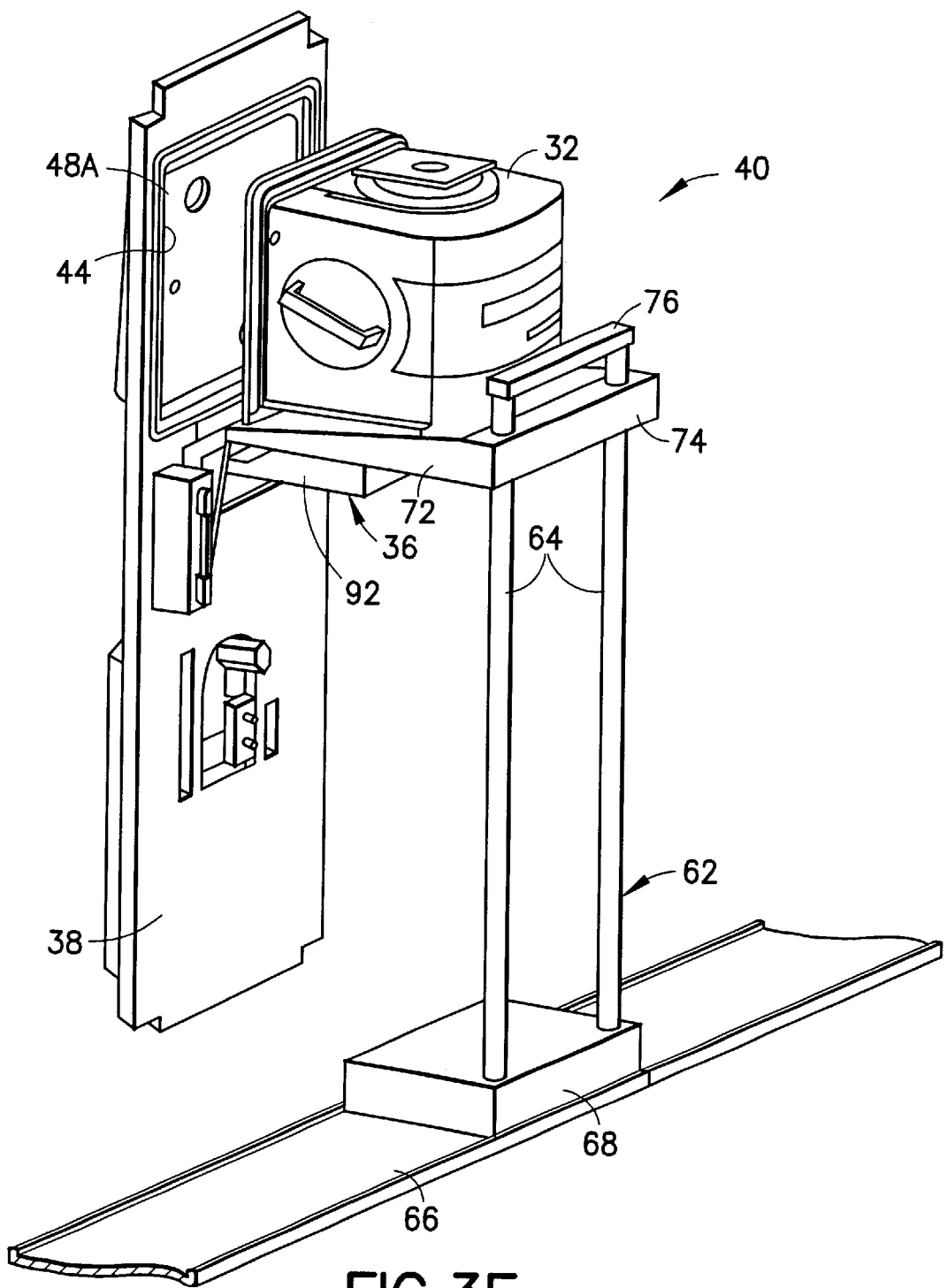
Figure 3F:
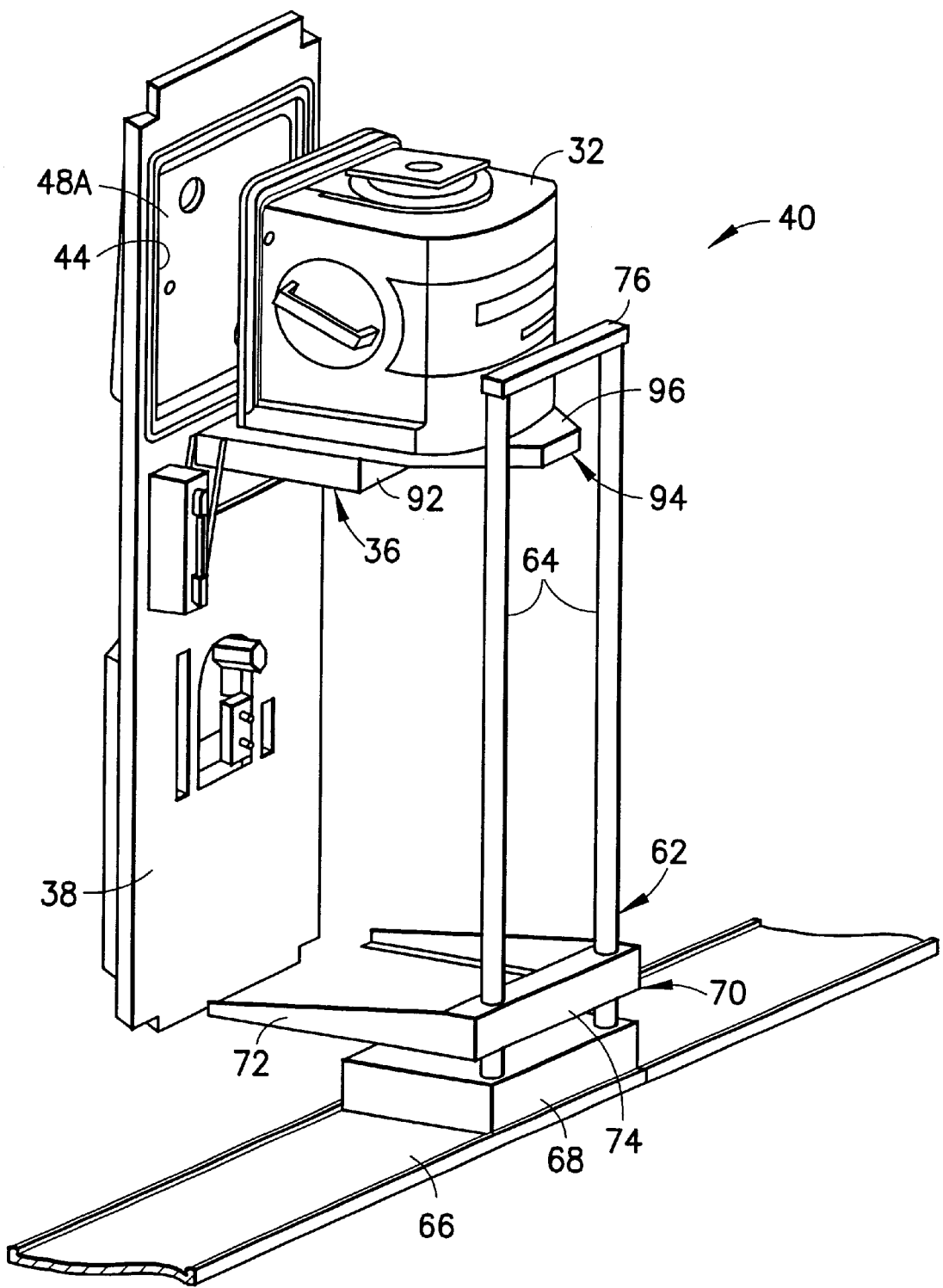
Figure 3G:
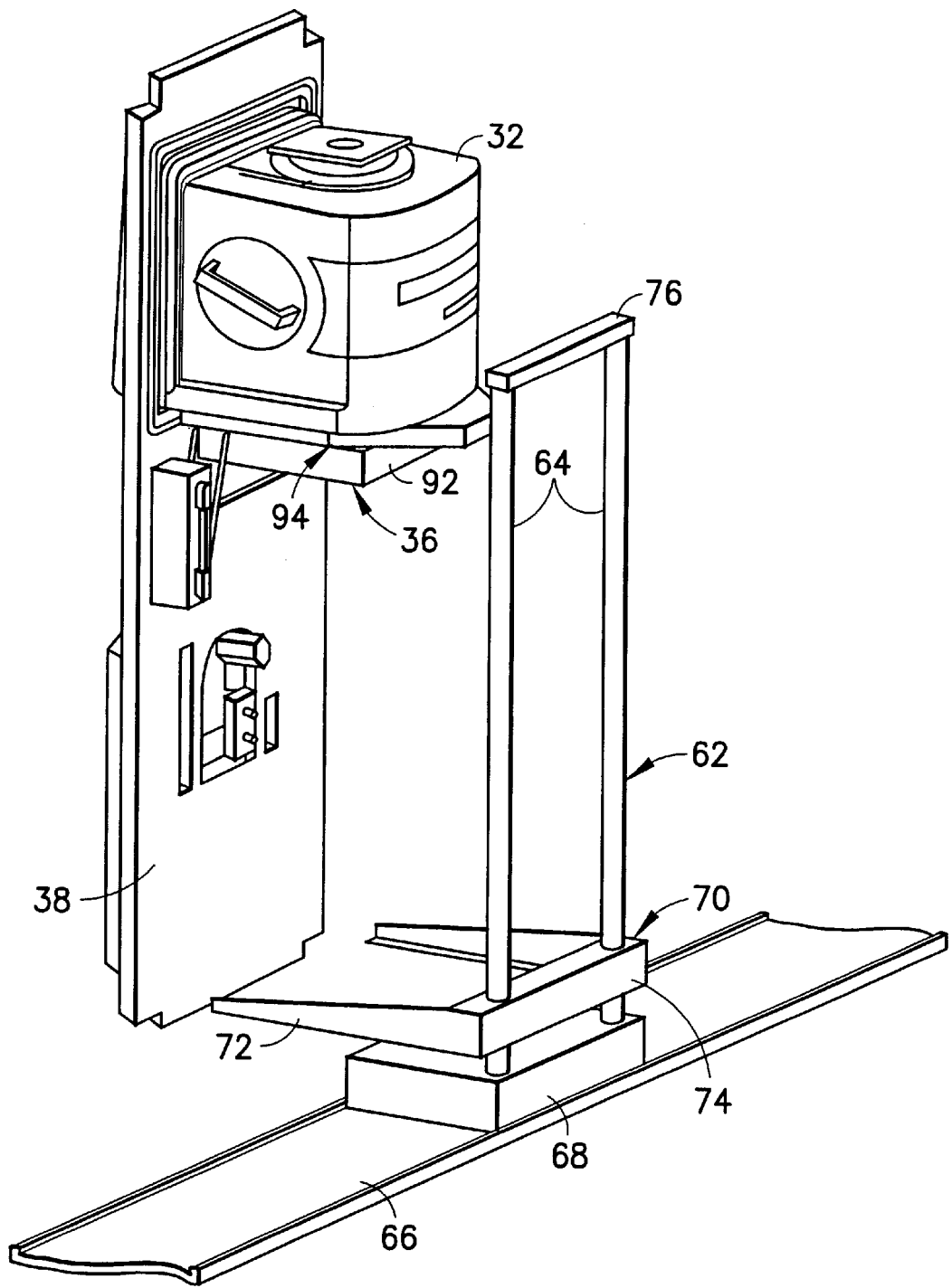
Figure 3H:
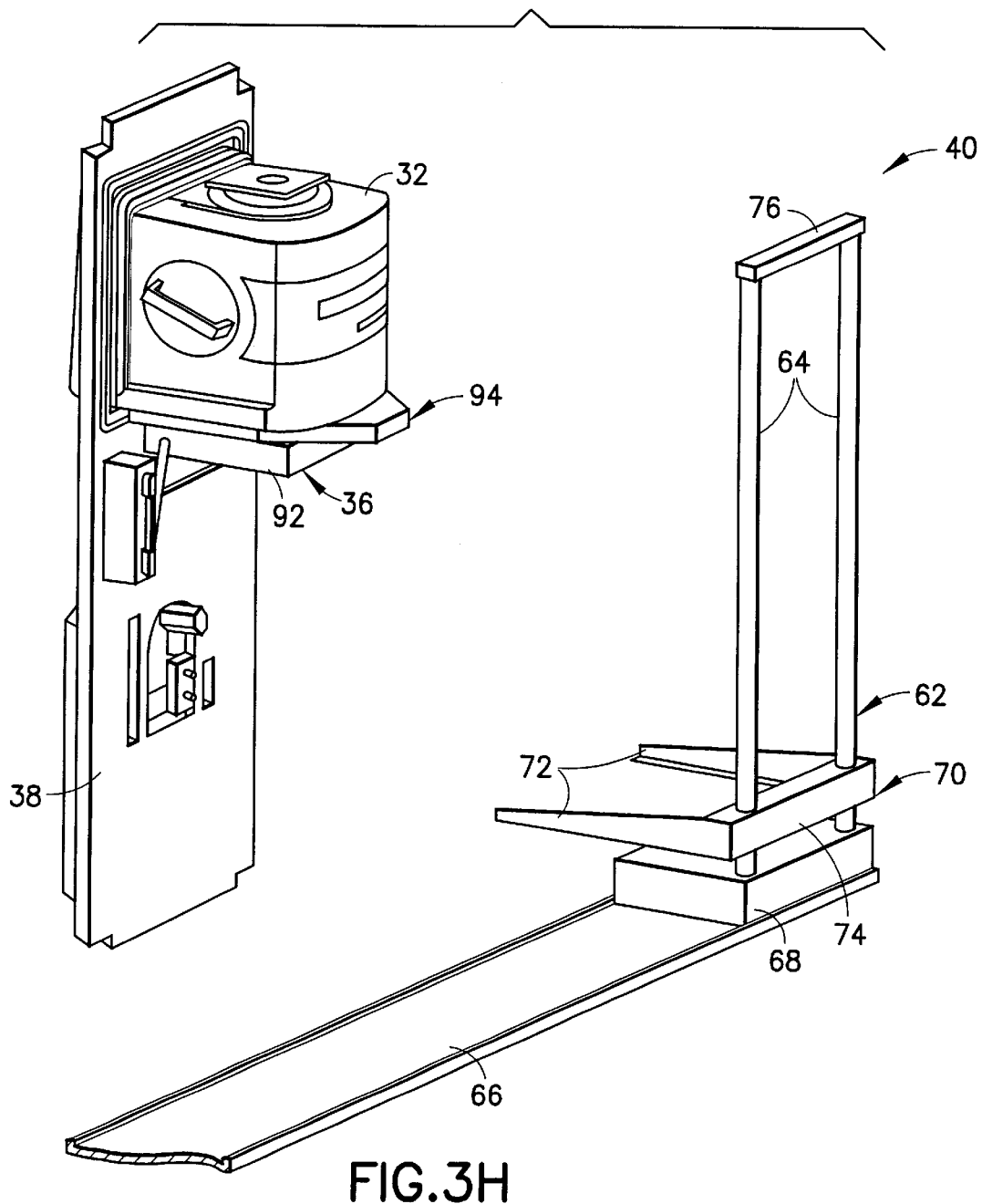

An elevational actuator 138 is fixed on an upright column 139 and via an associated actuator rod 140 raises and lowers a closure door 48A of the closure 48 in the manner depicted by the double headed arrow 108 between the respective positions illustrated in FIGS. 2 and 2A. A swing actuator 142 is suitably fixed on the frame 38 and in a suitable manner operably connected to the upright column 139 to effect rotation of the upright column and of the arm 124 mounted thereon about the axis 136 in the manner depicted by the double headed arrow 137. The actuators 138, 142 operate in a combined manner such that as the closure 48 is moved from the FIG. 2 position to the FIG. 2A position, the closure is not only raised but moved into a contiguous relationship with that region of the frame 38 surrounding the charging opening 44. With this construction and operation, the integrity of the interior of the process tool 20 is assured.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A system positioned adjacent a process tool having a reception region for loading and unloading cassettes adapted to support therein a plurality of semiconductor wafers comprising:

a frame having a charging opening in communication with the reception region of the process tool;

a platform mounted on the frame and movable between a deployed position and a retracted position, the platform in the deployed position having a generally level orientation adjacent the charging opening and projecting away from the frame for receiving thereon a cassette;

a movable closure for the charging opening for opening and closing a horizontal path through the charging opening;

an actuating mechanism for moving the platform between the retracted position and the deployed position; and an elevational transporter mechanism for moving the platform elevationally between the retracted lowered position and the deployed raised position, the elevational transporter including:

a pair of upright parallel spaced apart elevational slides mounted on the frame;

an upright drive screw mounted on the frame intermediate the pair of elevational slides for rotation about a longitudinal axis;

drive means for rotating the upright drive screw; and the platform having a tapped bore threadedly engaged with the upright drive screw and a pair of spaced apart bores for slidably receiving the elevational slides, respectively, such that rotation in one direction of the upright drive screw causes the platform to be raised and such that rotation in an opposite direction of the upright drive screw causes the platform to be lowered.

2. A system as set forth in claim 1 wherein the platform includes:

a shuttle stage; and a cassette mount having an upper surface for receiving the cassette thereon when the platform is in the generally level orientation reciprocably mounted on the shuttle stage with the cassette thereon in plane between a retracted position distant from the charging opening and a deployed position proximate the charging opening.

3. A load port module as set forth in claim 2 including:

a platform actuator mounted on the shuttle stage and having an actuator rod fixed to the platform at a location distant from the platform actuator for moving the platform between the withdrawn position distant from the charging opening and the advanced position proximate the charging opening.

4. load port module as set forth in claim 1 including:

an arm connected to the closure to move the closure between the first and second positions, the arm being movable in at least two different directions angled relative to each other to move the closure in the at least two different directions.

5. A load port module as set forth in claim 4 wherein the arm is rotatably connected to the frame.

6. A load port module as set forth in claim 4 wherein the arm is longitudinally movably connected to the frame.

7. A load port module as set forth in claim 4 wherein a first one of the directions comprises a generally horizontally outward direction away from the opening and a second one of the directions comprises a direction away from a horizontal path into and out of the opening.

8. A load port module as set forth in claim 4 wherein the second direction is a downward direction.

9. A load port module as set forth in claim 4 including:
a first drive connected to the arm to move the arm in a first one of the directions and a second drive connected to the arm to move the arm in a second one of the directions.

10. A load port module as set forth in claim 4 wherein at least one of the drives is a rotary motion drive.

11. A load port module as set forth in claim 4 wherein at least one of the drives is a straight linear motion drive.

12. A system for loading and unloading cassettes adapted to support therein a plurality of semiconductor wafers comprising:
a frame having a charging opening;
a platform mounted on the frame and movable between a deployed position and a retracted position, the platform in the deployed position having a generally level orientation adjacent the charging opening and projecting away from the frame for receiving thereon a cassette, the platform having generally parallel spaced apart side surfaces and a front surface spaced from the frame; and
a movable closure for the charging opening for opening and closing a horizontal path through the charging opening; and
a transport system for transporting, in one instance, a cassette containing a plurality of semiconductor wafers from a remote location and delivering the cassette to the platform when in a generally level orientation and, in another instance, for removing the cassette from the platform and delivering the cassette to a location remote from the platform, the transport system including a nest member for supporting a cassette at spaced apart locations enabling reception therebetween of the platform in the deployed position so that the cassette can selectively be transferred, in one instance, from the nest member to the platform and, in another instance, from the platform to the nest member, the transport system including a guided vehicle, a pair of upright parallel spaced apart elevator rods mounted on the guided vehicle, the nest member being mounted for vertical movement on the elevator rods, the nest member including a pair of parallel transversely projecting lifting forks being spaced by a dimension slightly greater than spacing between the side surfaces of the platform such that when the nest member is laterally aligned with the platform the lifting forks are coextensive with the side surfaces, the transfer of the cassette between the nest member and the platform is enabled.

13. A system as set forth in claim 12 wherein the nest member includes a bight, the lifting forks extending away from the bight and the bight being generally proximate the front surface of the platform when the lifting forks are coextensive with the side surfaces.

14. A system as set forth in claim 12 wherein the platform has generally parallel spaced apart side surfaces and a front surface spaced from the frame; and
wherein the transport system includes:
a guided vehicle;
the nest member being mounted on the guided vehicle for vertical movement, the nest member including a pair of parallel transversely projecting lifting forks being spaced by a dimension slightly greater than spacing between the side surfaces of the platform such that when the nest member is laterally aligned with the platform the lifting forks are coextensive with the side surfaces, the transfer of the cassette between the nest member and the platform is enabled.

15. A system as set forth in claim 12 wherein the platform has generally parallel spaced apart side surfaces and a front surface spaced from the frame; and
wherein the transport system includes:
a guided vehicle;
the nest member including a pair of parallel transversely projecting lifting forks being spaced by a dimension slightly greater than spacing between the side surfaces of the platform such that when the nest member is laterally aligned with the platform the lifting forks are coextensive with the side. surfaces, the transfer of the cassette between the nest member and the platform is enabled.

16. A system as set forth in claim 12 wherein the guided vehicle includes:
a cross member joining upper ends of the elevator rods;
an upright drive screw extending between upper and lower ends intermediate the pair of elevator rods for rotation about a longitudinal axis, a lower end rotatably mounted on the guided vehicle, an upper end rotatably mounted on the cross member; and
drive means for rotating the upright drive screw;
the cross member having a tapped bore threadedly engaged with the upright drive screw and a pair of spaced apart bores for slidably receiving the elevational slides, respectively, such that rotation in one direction of the upright drive screw causes the nest to be raised and such that rotation in an opposite direction of the upright drive screw causes the nest to be lowered.

17. A method of loading and unloading cassettes adapted to support therein a plurality of semiconductors comprising the steps of:
(a) moving a platform mounted on a frame between a deployed position and a retracted position, the platform in the deployed position having a generally level orientation adjacent a charging opening and projecting away from the frame for receiving a cassette thereon;
(b) selectively operating a movable closure at the charging opening for opening and closing a horizontal path through the charging opening;
(c) rotationally moving the platform on the frame between the deployed position having a generally level orientation located generally adjacent the charging opening and a retracted position folded against the frame;
(d) in one instance, transporting a cassette containing a plurality of semiconductor wafers from a remote location and delivering the cassette to the platform when in a generally level orientation; and
(e) in another instance, retrieving the cassette from the platform and transporting the cassette to a location remote from the platform; and
wherein steps (c) and (d) include the steps of:
(f) providing a guided vehicle including a nest member for supporting a cassette at spaced apart locations enabling reception therebetween of the platform in the deployed position;
(g) lowering the nest member relative to the platform in one instance so that the cassette can be transferred from the nest member to the platform; and
(h) raising the nest member relative to the platform in another instance so that the cassette can be transferred from the platform to the nest member.

* * * * *